(12) United States Patent
Nishikawa et al.

(10) Patent No.: US 11,422,746 B2
(45) Date of Patent: Aug. 23, 2022

(54) MEMORY SYSTEM HAVING MEMORY DEVICE AND CONTROLLER

(71) Applicant: Kioxia Corporation, Tokyo (JP)

(72) Inventors: Suguru Nishikawa, Osaka (JP); Yoshihisa Kojima, Kanagawa (JP); Takehiko Amaki, Kanagawa (JP)

(73) Assignee: KIOXIA CORPORATION, Tokyo (JP)

( * ) Notice: Subject to any disclaimer, the term of this patent is extended or adjusted under 35 U.S.C. 154(b) by 39 days.

(21) Appl. No.: 17/002,173

(22) Filed: Aug. 25, 2020

(65) Prior Publication Data

US 2021/0124529 A1 Apr. 29, 2021

(30) Foreign Application Priority Data

Oct. 29, 2019 (JP) .............................. JP2019-196427

(51) Int. Cl.

| | |
|---|---|
| *G06F 12/00* | (2006.01) |
| *G06F 3/06* | (2006.01) |
| *G11C 16/26* | (2006.01) |
| *G11C 16/34* | (2006.01) |
| *G11C 16/04* | (2006.01) |
| *G11C 11/56* | (2006.01) |

(52) U.S. Cl.
CPC .......... *G06F 3/0659* (2013.01); *G06F 3/0619* (2013.01); *G06F 3/0679* (2013.01); *G11C 16/0483* (2013.01); *G11C 16/26* (2013.01); *G11C 16/3427* (2013.01); *G11C 11/5642* (2013.01); *G11C 11/5671* (2013.01)

(58) Field of Classification Search
CPC ...... G06F 3/065; G06F 3/0604; G06F 3/0659; G06F 3/067; G06F 16/128; G06F 3/0689
USPC ....................................................... 711/103
See application file for complete search history.

(56) References Cited

U.S. PATENT DOCUMENTS

| | | | |
|---|---|---|---|
| 9,230,689 B2 | 1/2016 | Tuers et al. | |
| 9,530,517 B2 | 12/2016 | Lee et al. | |
| 2016/0019974 A1 | 1/2016 | Blodgett | |
| 2017/0123724 A1* | 5/2017 | Park | G11C 11/5628 |
| 2017/0206006 A1* | 7/2017 | Liao | G06F 11/1044 |
| 2020/0090763 A1* | 3/2020 | Tokutomi | G11C 16/0483 |

* cited by examiner

*Primary Examiner* — Mardochee Chery
(74) *Attorney, Agent, or Firm* — Foley & Lardner LLP

(57) ABSTRACT

A memory system includes a memory device having a memory cell array, and a controller. The memory cell array includes a plurality of first units and at least one second unit. The second unit includes the plurality of first units. The controller counts a first number of times of read operation for each of the plurality of first units, and, in response to the first number of times for one first unit among the plurality of first units reaching a first value, updates a second number of times for the second unit that includes the one first unit. In response to the second number of times reaching a second value, the controller determines whether to rewrite data stored in at least one of the first units included in the second unit.

20 Claims, 21 Drawing Sheets

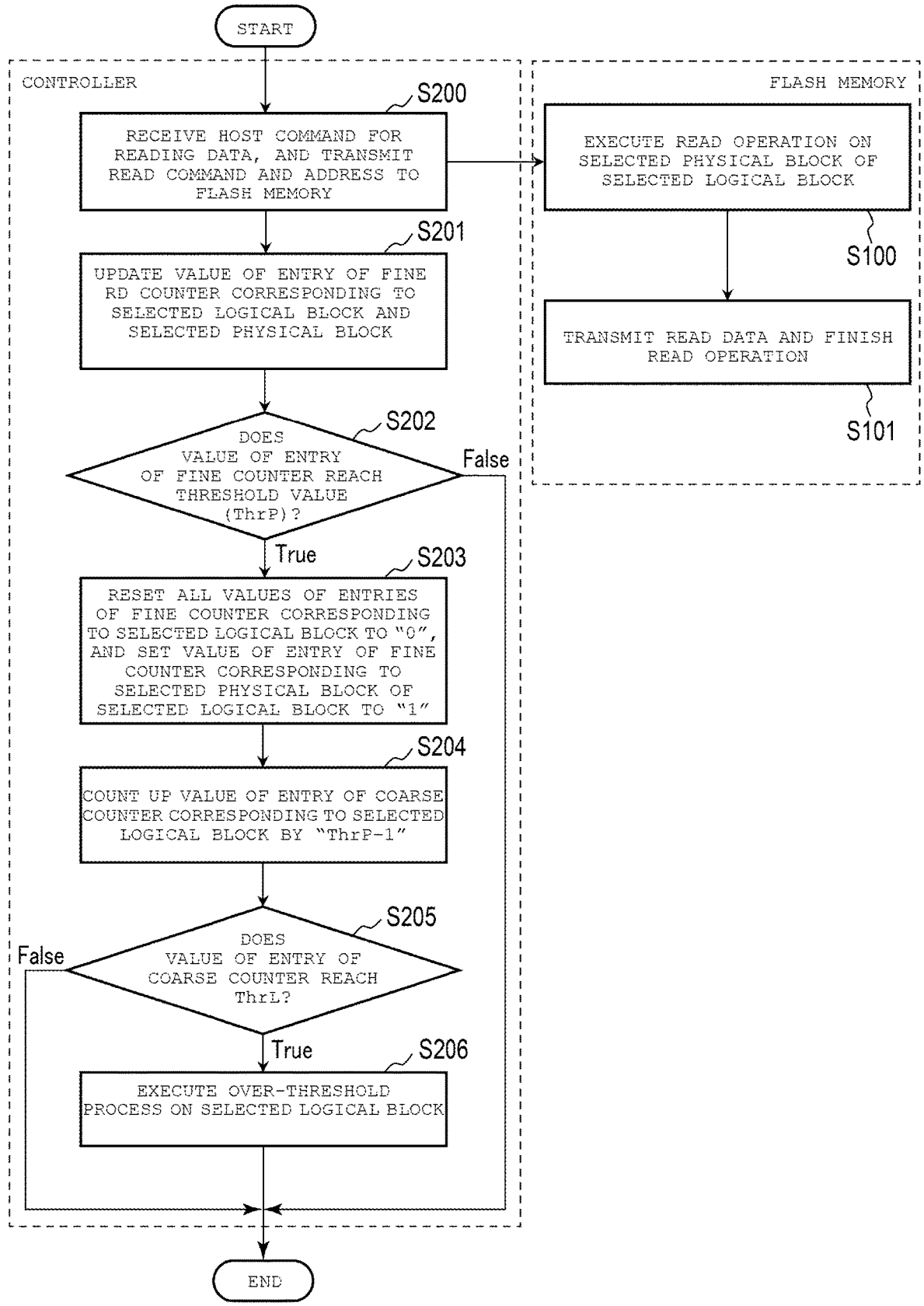

MEMORY SYSTEM HAVING MEMORY DEVICE AND CONTROLLER

CROSS-REFERENCE TO RELATED APPLICATION

This application is based upon and claims the benefit of priority from Japanese Patent Application No. 2019-196427, filed Oct. 29, 2019, the entire contents of which are incorporated herein by reference.

FIELD

Embodiments described herein relate generally to a memory system.

BACKGROUND

Some examples of memory systems using a NAND flash memory are disclosed in U.S. Pat. No. 9,230,689; U.S. Patent Application No. 2016/0019974; and U.S. Pat. No. 9,530,517.

DESCRIPTION OF THE DRAWINGS

FIG. 7 is a flowchart of an operation example of the memory system of the first embodiment.

DETAILED DESCRIPTION

Figure 1:
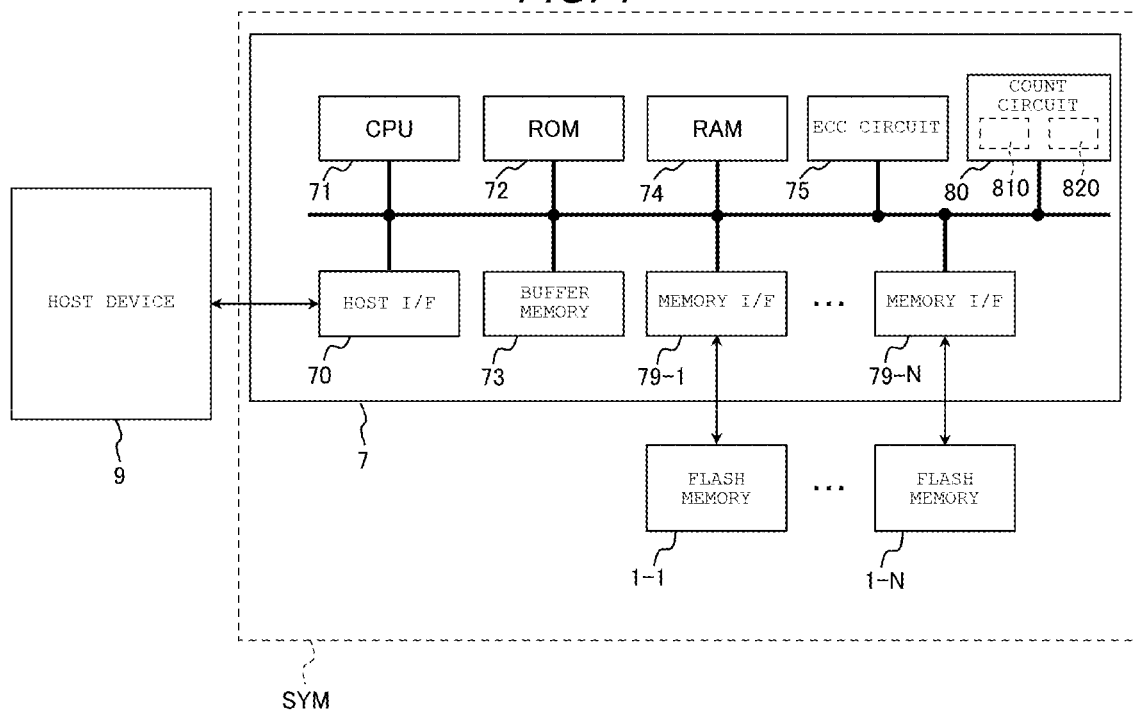
FIG. 1 is a diagram illustrating a configuration example of a memory system of a first embodiment.

The performance of a memory system is improved with the present invention, for which exemplary embodiments are disclosed herein.

In general, according to at least one embodiment, there is provided a memory system including a memory device having a memory cell array including a plurality of first units and at least one second unit and a controller. The second unit includes the plurality of first units. The controller is configured to count a first number of times of read operation for each of the plurality of first units, and in response to the first number of times for one first unit among the plurality of first units reaching a first value, update a second number of times for the second unit that includes the one first unit, and, in response to the second number of times reaching a second value, determine whether to rewrite data stored in at least one of the first units included in the second unit.

With reference to FIGS. 1 to 24, memory systems of embodiments and control methods therefor will be described.

Hereinafter, with reference to the drawings, each embodiment will be described in detail. In the following descriptions, an element having the same function and configuration will be given the same reference numeral.

In each of the following embodiments, when elements (for example, word lines WL, bit lines BL, and various voltages and signals) with numbers/alphabetic characters at ends thereof for differentiation among them may not be differentiated from each other, expressions (reference numerals) with no numbers/alphabetic characters at ends thereof are used.

(1) First Embodiment

With reference to FIGS. 1 to 12, a memory system of the first embodiment and a control method for the memory system will be described.

(a) Configuration Example

With reference to FIGS. 1 to 6, a configuration example of a memory system of at least one embodiment will be described.

FIG. 1 is a block diagram illustrating a configuration example of a memory system of at least one embodiment.

A memory system SYM of at least one embodiment is electrically connected to a host device 9.

The memory system SYM transfers and/or stores data according to a command (hereinafter, referred to as a host command) from the host device 9.

The memory system SYM of at least one embodiment includes one or more (for example, N where N is a natural number of one or greater) memory devices 1 and a controller 7.

The controller 7 instructs data to be written into the memory device 1 (for example, a write operation), data to be read from the memory device 1 (for example, a read operation), and data in the memory device 1 to be erased (for example, an erase operation), according to host commands from the host device 9. The controller 7 manages data in the memory device 1.

An internal configuration of the controller 7 will be described later.

The memory device 1 stores data.

<Configuration Example of Memory Device>

Figure 2:
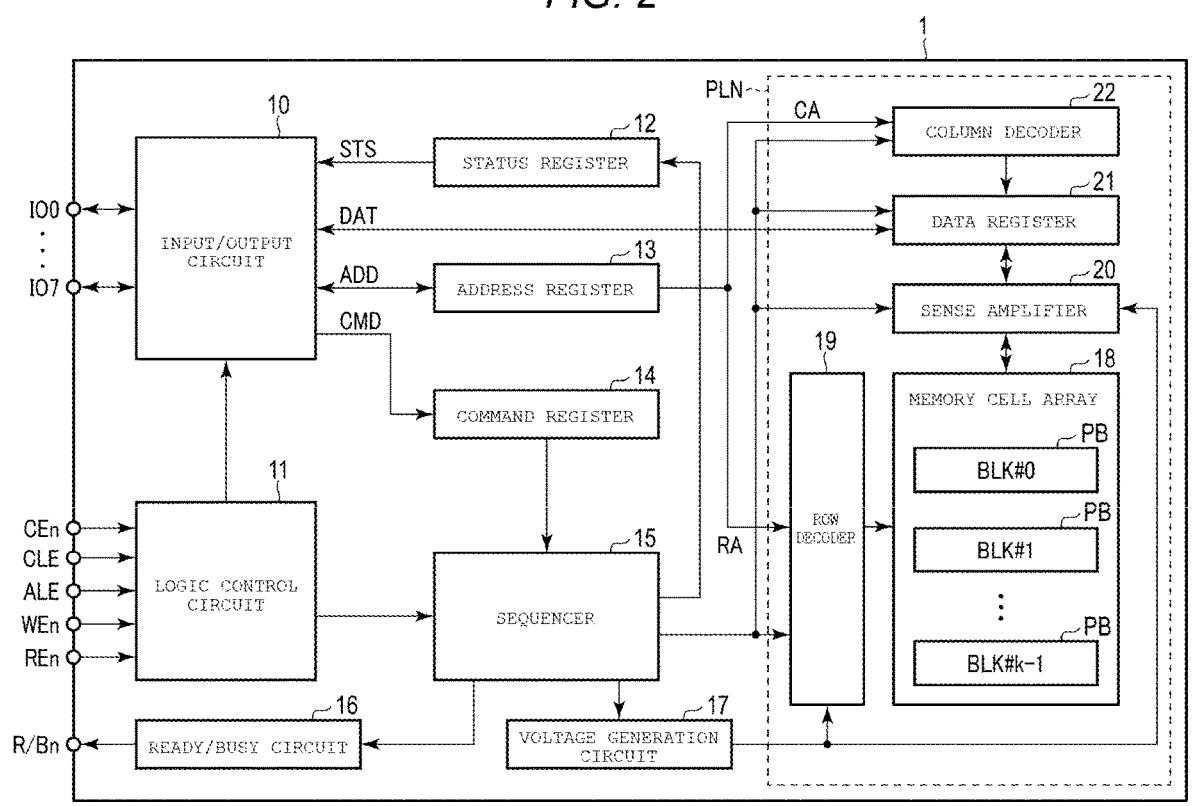
FIG. 2 is a diagram illustrating a configuration example of a memory device.

FIG. 2 is a block diagram illustrating a configuration example of the memory device of the memory system of the present embodiment.

As illustrated in FIG. 2, the memory device 1 includes, for example, an input/output circuit 10, a logic control circuit 11, a status register 12, an address register 13, a command register 14, a sequencer 15, a ready/busy circuit 16, a voltage generation circuit 17, a memory cell array 18, a row decoder 19, a sense amplifier 20, a data register 21, and a column decoder 22.

The input/output circuit 10 controls input and output of signals IO (IO0 to IO7).

The input/output circuit 10 sends data (for example, write data) DAT from the controller 7 to the data register 21. The input/output circuit 10 sends an address ADD from the controller 7 to the address register 13. The input/output circuit 10 sends a command CMD from the controller 7 (hereinafter, referred to as a controller command) to the command register 14. The input/output circuit 10 sends status information from the status register 12 to the controller 7. The input/output circuit 10 sends data (read data) DAT from the data register 21 to the controller 7. The input/output circuit 10 sends an address ADD from the address register 13 to the controller 7.

The logic control circuit 11 receives a chip enable signal CEn, a command latch enable signal CLE, an address latch enable signal ALE, a write enable signal WEn, and a read enable signal REn, from the controller 7. The logic control circuit 11 controls the input/output circuit 10 and the sequencer 15 according to a received signal.

The status register 12 temporarily stores status information, for example, in writing, reading, and erasing of data. The controller 7 acquires the status information, and determines whether an operation has normally finished.

The address register 13 temporarily stores the address ADD received from the controller 7 via the input/output circuit 10. The address register 13 transmits a row address RA to the row decoder 19, and transmits a column address CA to the column decoder 22.

The command register 14 temporarily stores the controller command CMD received via the input/output circuit 10. The command register 14 transmits the controller command CMD to the sequencer 15.

The sequencer 15 controls the overall operation of the memory device 1. The sequencer 15 controls, for example, the status register 12, the ready/busy circuit 16, the voltage generation circuit 17, the row decoder 19, the sense amplifier 20, the data register 21, and the column decoder 22 according to the controller command CMD. Consequently, the sequencer 15 executes a write operation, a read operation, an erase operation, and the like.

The ready/busy circuit 16 controls a signal level of a ready/busy signal R/Bn according to an operation status of the memory device 1. The ready/busy circuit 16 sends the ready/busy signal R/Bn to the controller 7.

The voltage generation circuit 17 generates voltages used for the write operation, the read operation, and the erase operation according to the control of the sequencer 15. The voltage generation circuit 17 supplies the generated voltages to, for example, the memory cell array 18, the row decoder 19, and the sense amplifier 20. The row decoder 19 and the sense amplifier 20 apply the voltages supplied from the voltage generation circuit 17 to memory cells of the memory cell array 18.

The memory cell array 18 includes a plurality of physical blocks PB. Each physical block PB includes a memory cell (hereinafter, also referred to as a memory cell transistor) correlated with a row and a column.

The row decoder 19 decodes the row address RA. The row decoder 19 controls activation or inactivation (in other words, selection or non-selection) of the physical block PB, a word line, and the like based on the decoding result. The row decoder 19 applies an operation voltage to the memory cell array (that is, to the physical block PB).

The sense amplifier (hereinafter, also referred to as a sense amplifier module) 20 senses a signal being output from the memory cell array 18 during a read operation. Data is determined based on the sensed signal. This data is used as read data. The sense amplifier 20 sends the read data to the data register 21. The sense amplifier 20 also controls a voltage of a bit line BL of the memory cell array 18 based on write data during a write operation.

For example, the sense amplifier 20 includes a plurality of sense amplifier circuits. A single sense amplifier circuit is connected to corresponding one or a plurality of bit lines.

The data register 21 stores write data and read data. During a write operation, the data register 21 sends write data received from the input/output circuit 10 to the sense amplifier 20. During a read operation, the data register 21 sends read data RD received from the sense amplifier 20 to the input/output circuit 10.

The column decoder 22 decodes the column address CA. The column decoder 22 controls the sense amplifier 20 and the data register 21 according to the decoding result.

In the memory system of the present embodiment, the memory device 1 may be a NAND flash memory (hereinafter, simply referred to as a flash memory in some cases). However, the memory device 1 may be memories other than the NAND flash memory, such as a magnetoresistive random access memory (MRAM), a phase change memory (PCM), a resistive random access memory (ReRAM), and a ferroelectric random access memory (FeRAM).

Figure 3:
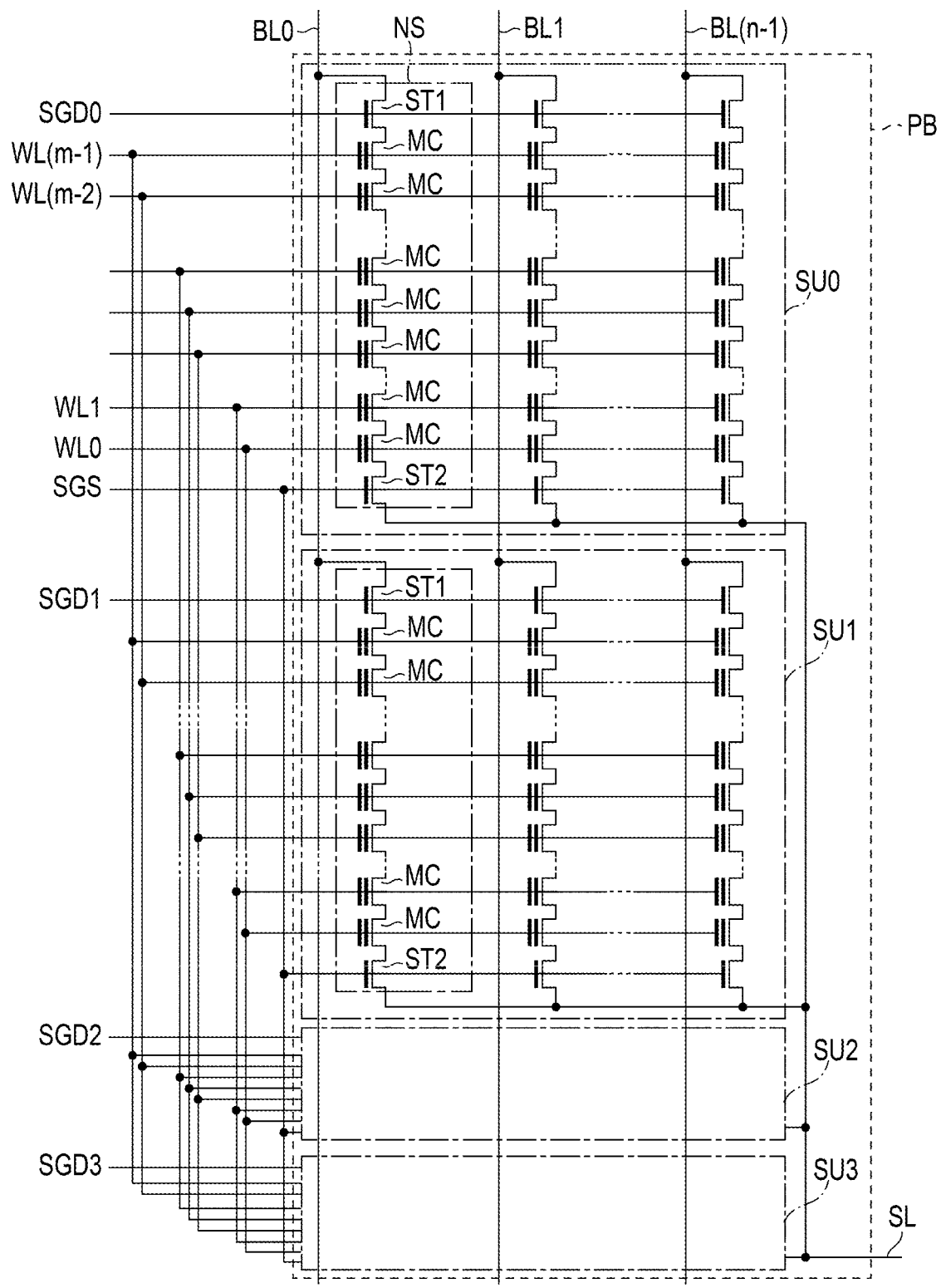
FIG. 3 is a diagram illustrating a configuration example of a memory cell array.

FIG. 3 is a schematic circuit diagram illustrating an example of a configuration of the memory cell array in the NAND flash memory of at least one embodiment.

As illustrated in FIG. 3, in the memory cell array 18, a physical block PB includes, for example, four string units SU (for example, SU0 to SU3). Each string unit SU includes a plurality of NAND strings NS. Each NAND string NS includes, for example, a plurality of (for example, m) memory cells MC, and two select transistors ST1 and ST2. The number of select transistors ST1 and ST2 in the NAND string NS may be freely selected, and the number of each of select transistors ST1 and ST2 may be one or more. Here, m is an integer of one or greater.

The memory cell MC has a control gate and a charge storage layer. This enables the memory cell MC to store data in a nonvolatile manner. The memory cell MC may be of a charge trap type in which an insulating layer (for example, a silicon nitride film) is used for the charge storage layer, and may be of a floating gate type in which a conductive layer (for example, a silicon layer) is used for the charge storage layer.

The plurality of memory cells MC are connected in series between a source of the select transistor ST1 and a drain of the select transistor ST2. Current paths of the plurality of memory cells MC are connected in series between the two select transistors ST1 and ST2. A terminal (for example, a drain) of a current path of the memory cells MC on the most drain side in the NAND string NS is connected to the source of the select transistor ST1. A terminal (for example, a source) of a current path of the memory cells MC on the most source side in the NAND string NS is connected to the drain of the select transistor ST2.

In each of the string units SU0 to SU3, a gate of the select transistor ST1 is connected to corresponding one of drain-side select gate lines SGD0 to SGD3. In the respective string units SU0 to SU3, gates of the select transistor ST2 are connected in common to a single source-side select gate line SGS. Select gate lines SGS that are independent from each other may be respectively connected to the string units SU0 to SU3.

The control gate of a certain memory cell MC in the block PB is connected to corresponding one of a plurality of word lines WL0 to WL(m-1).

The drains of the select transistors ST1 of the respective NAND strings NS in the string unit SU are respectively connected to different bit lines BL0 to BL(n-1). Here, n is an integer of one or greater. Each common bit line BL is connected to a single NAND string NS in each string unit SU among a plurality of blocks PB.

The sources of the plurality of select transistors ST2 are connected in common to a source line SL. For example, the plurality of string units SU in the block PB are connected in common to the common source line SL.

The string unit SU is an aggregate of the NAND strings NS that are connected to the different bit lines BL and are connected to the same select gate line SGD. The block PB is an aggregate of a plurality of string units SU sharing the word line WL. The memory cell array 18 is an aggregate of a plurality of blocks PB sharing the bit line BL.

A data write operation and a data read operation are collectively executed on a plurality of memory cells MC connected to one word line WL in one selected string unit SU among the plurality of string units SU. In the following description, a group including a plurality of memory cells MC collectively selected during the data write operation and the data read operation will be referred to as a memory cell group. A group of 1-bit data written into each of a plurality of memory cells in a single memory cell group or a group of 1-bit data read from each of a plurality of memory cells in a single memory cell group will be referred to as a page. One or more pages are allocated to a single memory cell group.

A data erase operation is executed in a unit of the physical block PB. However, the data erase operation may alternatively be executed in a unit smaller than the physical block PB.

The NAND flash memory 1 may include a plane PLN. A single plane PLN includes, for example, the memory cell array 18, the row decoder 19, the sense amplifier 20, the data register 21, and the column decoder 22. In the example of the NAND flash memory 1 illustrated in FIG. 2, only one plane PLN is illustrated. The NAND flash memory 1 may include two or more planes PLN. When the NAND flash memory 1 includes a plurality of planes PLN, respective planes PLN can execute different operations at different timings under the control of the sequencer 15.

Figure 4:
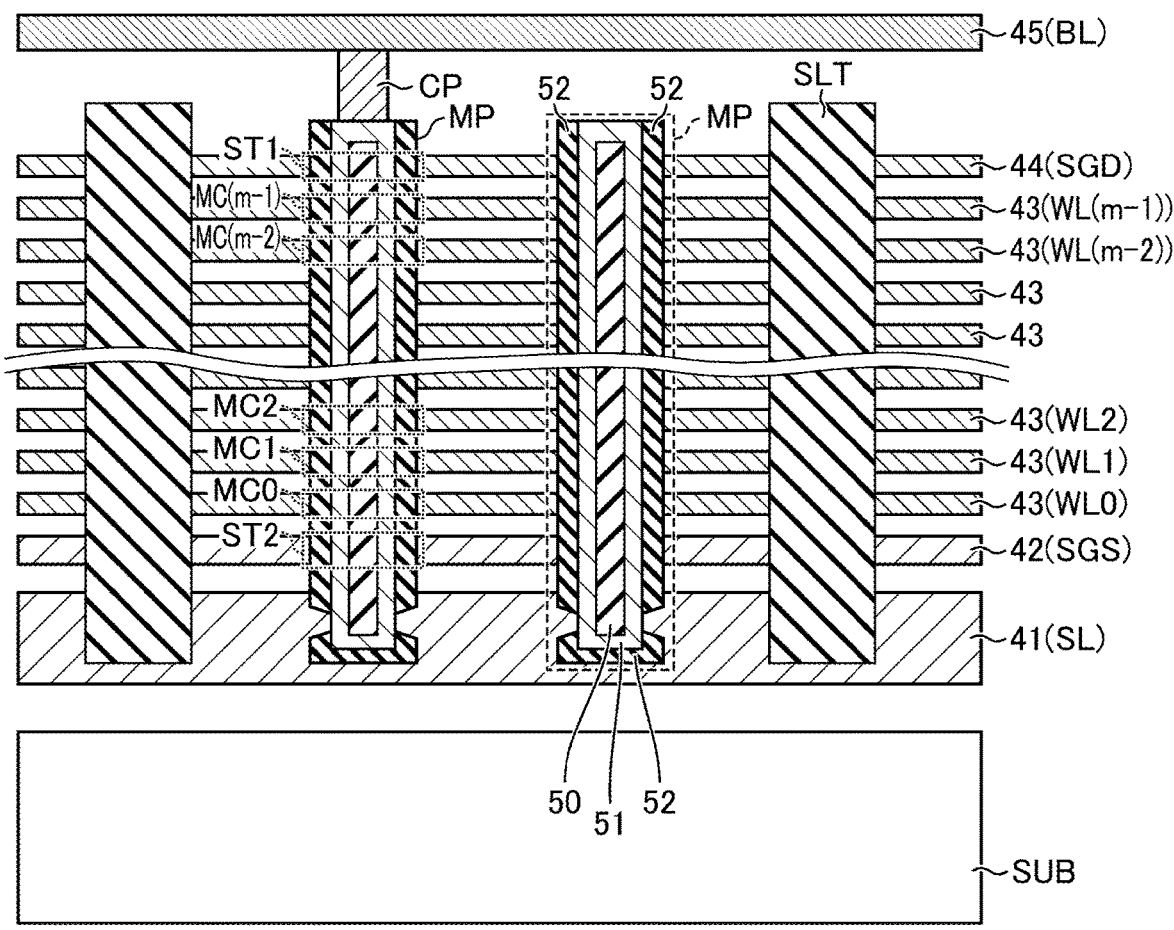
FIG. 4 is a diagram illustrating a structure example of the memory cell array.

FIG. 4 is a sectional view illustrating an example of a sectional structure of the memory cell array 18 of the flash memory of the present embodiment.

As illustrated in FIG. 4, the memory cell array 18 is provided over a semiconductor substrate SUB in a Z direction via an interlayer insulating film (not illustrated). The memory cell array 18 includes, for example, a plurality of conductive layers 41 to 45 and a plurality of memory pillars MP.

The conductive layer 41 is provided over the semiconductor substrate SUB in the Z direction. For example, the conductive layer 41 has a tabular shape that spreads along an XY plane parallel to the surface of the semiconductor substrate SUB. The conductive layer 41 is used as the source line SL of the memory cell array 18. The conductive layer 41 may contain, for example, silicon (Si).

The conductive layer 42 is provided over the conductive layer 41 in the Z direction via an insulating layer (not illustrated). For example, the conductive layer 42 has a tabular shape spreading along the XY plane. The conductive layer 42 is used as the select gate line SGS. The conductive layer 42 may contain, for example, silicon (Si).

The insulating layers (not illustrated) and the conductive layers 43 are alternately stacked over the conductive layer 42 in the Z direction. For example, each of the plurality of conductive layers 43 may have a tabular shape spreading along the XY plane. The plurality of stacked conductive layers 43 are respectively used as the word lines WL0 to WL(m-1) in this order from the semiconductor substrate SUB side. The conductive layer 43 contains, for example, tungsten (W).

The conductive layer 44 is provided over the uppermost conductive layer 43 among the plurality of stacked conductive layers 43 via an insulating layer (not illustrated). For example, the conductive layer 44 has a tabular shape spreading along the XY plane. The conductive layer 44 is used as the select gate line SGD and may contain, for example, tungsten (W).

The conductive layer 45 is provided over the conductive layer 44 in the Z direction via an insulating layer (not illustrated). For example, the conductive layer 45 has a linear shape extending along a Y direction. The conductive layer 45 is used as the bit line BL. As described above, a plurality of conductive layers 45 serving as the bit lines BL are arranged along an X direction. The conductive layer 45 contains, for example, copper (Cu).

The memory pillar MP has a columnar structure extending along the Z direction. The memory pillar MP penetrates through, for example, the conductive layers 42 to 44. An upper end of the memory pillar MP is provided between, for example, a region where the conductive layer 44 is provided and a region where the conductive layer 45 is provided. A lower end of the memory pillar MP is provided, for example, inside a region where the conductive layer 41 is provided.

The memory pillar MP includes, for example, a core layer 50, a semiconductor layer 51, and a stacked film 52.

The core layer 50 has a columnar structure extending along the Z direction. An upper end of the core layer 50 is provided in, for example, an upper region of the region where the conductive layer 44 is provided. A lower end of the core layer 50 is provided, for example, inside the region where the conductive layer 41 is provided. The core layer 50 contains an insulator such as silicon oxide ($SiO_2$).

The semiconductor layer 51 covers the core layer 50. The semiconductor layer 51 is indirect contact with the conductive layer 41 on, for example, a side surface (that is, a surface substantially perpendicular to the XY plane) of the memory pillar MP. The semiconductor layer 51 contains, for example, silicon (Si).

The stacked film 52 covers a side surface and a bottom surface of the semiconductor layer 51 except a portion where the conductive layer 41 and the semiconductor layer 51 are in contact with each other. The stacked film 52 includes a tunnel insulating layer, a charge storage layer, and a block insulating layer. The charge storage layer is provided between the tunnel insulating layer and the block insulating layer. The tunnel insulating layer is provided between the charge storage layer and the semiconductor layer 51. The block insulating layer is provided between the charge storage layer and the conductive layer 43, between the charge storage layer and the conductive layer 42, and between the charge storage layer and the conductive layer 44.

FIGS. 2 to 4 illustrate examples of a circuit configuration and a structure of the memory cell array of the NAND flash memory in at least one embodiment. A circuit configuration and a structure of the memory cell array are not limited to the examples illustrated in FIGS. 2 to 4.

<Configuration Example of Controller>

As illustrated in FIG. 1, the controller 7 includes, for example, a host interface circuit 70, a processor (for example, CPU) 71, a ROM 72, a buffer memory 73, a RAM 74, an ECC circuit 75, one or more (for example, N where N is a natural number of one or greater) memory interface circuits 79, and a count circuit 80.

Each function of the controller 7, which will be described later, may be implemented by firmware or hardware.

The controller 7 may be, for example, a system-on-a-chip (SoC).

The processor 71 controls the overall operation of the controller 7.

For example, the processor 71 issues a controller command in response to a request from the host device 9 (that is, a host command). The processor 71 sends the issued controller command to the memory interface circuit 79.

The processor 71 may execute various processes such as wear-leveling for managing the NAND flash memory 1. The controller 7 may execute garbage collection (also referred to as "compaction") or the like based on a determination by the processor 71 and instruct the NAND flash memory 1 to perform an erase operation.

The ROM 72 stores a control program (for example, firmware) and a plurality of pieces of setting information for the memory system SYM.

The buffer memory 73 is, for example, a dynamic random access memory (DRAM) or a static random access memory (SRAM). The buffer memory 73 temporarily stores data from the host device 9 and data from the NAND flash memory 1 during data transmission between the memory system SYM and the host device 9. The buffer memory 73 also temporarily stores data generated in the controller 7.

The RAM 74 is, for example, an SRAM or a DRAM. The RAM 74 is used as a work region of the processor 71.

For example, parameters, various management tables, and the like for managing the NAND flash memory 1 are loaded to the RAM 74. For example, the RAM 74 stores a queue of commands (that is, a command queue) received from the host device 9. The RAM 74 stores, for example, an address conversion table. The address conversion table is a table representing a correspondence relationship between a logical address that is a storage location of data designated by the host device 9 and a physical address that is a storage location of data written into the NAND flash memory 1. The address conversion table is stored in, for example, the NAND flash memory 1. The address conversion table is read from the NAND flash memory 1 and loaded to the RAM 74 at the time of starting up the memory system SYM.

The logical address indicates a logical storage location obtained based on an address designated from the host device 9. The physical address indicates a physical storage location in the flash memory (memory device) 1. The address conversion table outputs a physical address by inputting a logical address therein.

A logical block LB may be used as a management unit for data management and operation control. The logical block LB is a logical (virtual) management unit including one or more physical blocks PB. The logical block LB is a management unit larger than the physical block PB (i.e., upper management unit).

The ECC circuit 75 executes error detection and error correction on read data. Hereinafter, the error detection and the error correction executed by the ECC circuit 75 of the controller 7 will be referred to as an ECC process. During a data write operation, the ECC circuit 75 generates a parity based on data from the host device 9. The data and the parity are written into the NAND flash memory 1. During a data read operation, the ECC circuit 75 generates a syndrome based on data and a parity that are read, and determines the presence or absence of an error in the read data. When an error is included in the read data, the ECC circuit 75 identifies a position of the error in the read data, and corrects the error. Hereinafter, the error in the read data will be referred to as a fail bit.

In the ECC circuit 75, the number of correctable error bits is determined by, for example, the number of parity bits. When error bits more than correctable error bits are included in read data, error correction cannot be performed, and the data read operation fails. The ECC circuit 75 may perform likelihood decoding such as a low density parity check (LDPC).

The host interface circuit 70 is connected to the host device 9 through wireless communication or wired communication. The host interface circuit 70 performs communication between the memory system SYM and the host device 9. For example, the host interface circuit 70 controls transmission of data, a host command, and a logical address between the memory system SYM and the host device 9. The host interface circuit 70 supports a communication interface standard such as Serial Advanced Technology Attachment (SATA), Serial Attached SCSI (SAS), or PCI Express (PCIe). The host device 9 is, for example, a computer conforming to an interface such as SATA, SAS, or PCIe.

The memory interface circuit 79 is connected to the corresponding NAND flash memory 1. A single memory interface circuit 79 may be connected to a plurality of NAND flash memories 1. The memory interface circuit 79 performs communication between the controller 7 and the NAND flash memory 1. The memory interface circuit 79 is configured based on a NAND interface standard. A plurality of NAND flash memories 1 are controlled in parallel by the memory interface circuits 79 connected thereto.

The count circuit 80 counts the number of various operations executed in the NAND flash memory 1. For example, the count circuit 80 counts the number of read operations executed in the NAND flash memory 1.

The processor 71 manages the reliability or the like of data in the NAND flash memory 1 based on the operation counts from the count circuit 80.

The memory system SYM including the controller 7 and the NAND flash memory 1 may be a memory card such as an SD™ card, or a solid state drive (SSD).

<Relationship Between Data and Threshold Voltage of Memory Cell>

Figure 5:
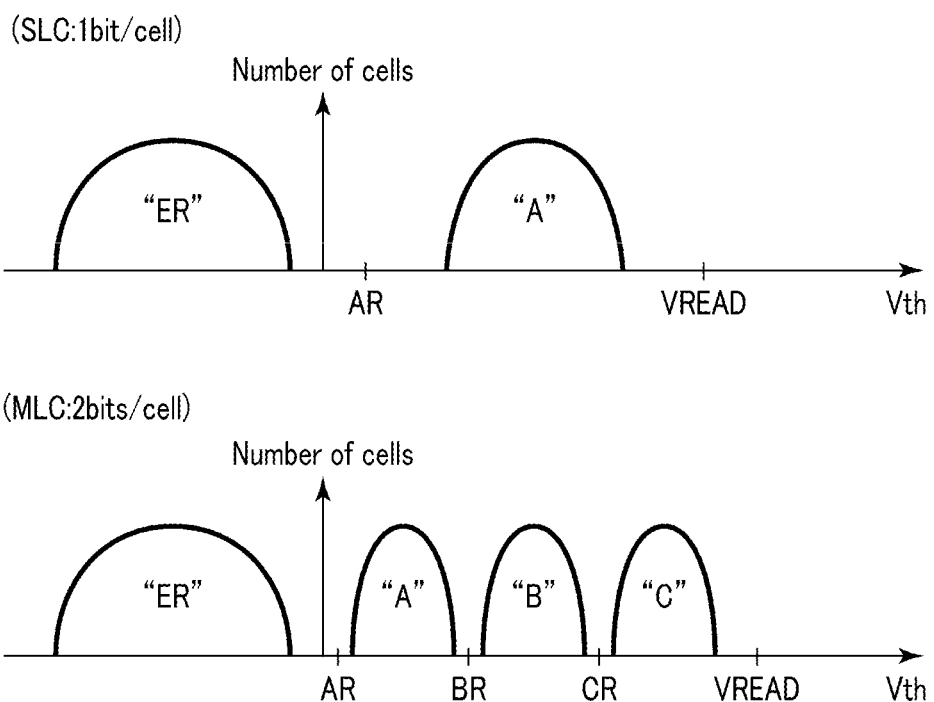
FIG. 5 is a diagram illustrating a relationship between data and a distribution of threshold voltages of memory cells.

FIG. 5 is a diagram illustrating a relationship between data and a distribution of threshold voltages of the memory cells in the flash memory.

FIG. 5 illustrates a distribution of threshold voltages of the memory cells and a read voltage. In FIG. 5, a longitudinal axis corresponds to the number of memory cells, and a transverse axis corresponds to a threshold voltage Vth of the memory cell.

FIG. 5 illustrates distributions of a plurality of threshold voltages corresponding to data stored in each memory cell. Hereinafter, as examples of write methods, a single-level cell (SLC) method of storing 1-bit data in a single memory cell MC and a multi-level cell (MLC) method of storing 2-bit data in a single memory cell MC will be illustrated.

In a case of the SLC method, two threshold voltages are set for the memory cell MC. The two threshold voltages will be referred to as an "ER" state and an "A" state in an order of increasing the threshold voltages. In the SLC method, for example, data of "1" is assigned to the "ER" state, and data of "0" is assigned to the "A" state.

In a case of the MLC method, four threshold voltages are set for the memory cell MC. The four threshold voltages will be referred to as an "ER" state, an "A" state, a "B" state, and a "C" state in an order of increasing the threshold voltages. In the MLC method, for example, the "Er" state, the "A" state, the "B" state, and the "C" state are respectively assigned to data of "11 (that is, lower/upper)", data of "01", data of "00", and data of "10".

In the threshold voltage distributions illustrated in FIG. 5, a read voltage (that is, a read level) is set between adjacent threshold voltage distributions.

For example, a read voltage AR is set between the maximum threshold voltage in the "ER" state distribution and the minimum threshold voltage in the "A" state distribution. The read voltage AR is used to detect whether a threshold voltage of the memory cell MC is in the threshold voltage distribution of the "ER" state or in the threshold voltage distribution of the "A" state or higher. When the read voltage AR is applied to the memory cells MC, memory cells corresponding to the "ER" state turn on (i.e., conductive), and memory cells corresponding to the "A" state, the "B" state, and the "C" state turn off (i.e., not conductive).

A read voltage BR is set between the threshold voltage distribution of the "A" state and the threshold voltage distribution of the "B" state, and a read voltage CR is set between the threshold voltage distribution of the "B" state and the threshold voltage distribution of the "C" state. When the read voltage BR is applied to the memory cells MC, memory cells corresponding to the "ER" state and the "A" state turn on, and memory cells corresponding to the "B" state and the "C" state turn off. When the read voltage CR is applied to the memory cells MC, memory cells corresponding to the "ER" state, the "A" state, and the "B" state turn on, and memory cells corresponding to the "C" state turn off.

A read pass voltage (in other words, a non-selection voltage) VREAD is set as a voltage applied to a non-selected word line during a read operation. A voltage of the read pass voltage VREAD is higher than the maximum threshold voltage in the highest threshold voltage distribution. The memory cell MC of which the read pass voltage VREAD is applied to the gate turns on regardless of data stored therein.

The number of bits of data stored in a single memory cell MC and assignment of data to a threshold voltage of the memory cell MC, described above, are only examples. For example, data of three or more bits may be stored in a single memory cell MC. Data that is different from the above description may be assigned to a threshold voltage.

Each of a read voltage and a read pass voltage may be set to the same voltage value in each method, and may be set to different voltage values. For example, as illustrated in FIG. 5, a voltage of the read pass voltage VREAD in the MLC method may be set to be higher than a voltage of the read pass voltage VREAD in the SLC method. Similarly, for example, a voltage of the read pass voltage VREAD in a triple-level cell (TLC) method of storing 3-bit data in a single memory cell MC may be set to be higher than a voltage of the read pass voltage VREAD in the MLC method. A voltage of the read pass voltage VREAD in a quadruple-level cell (QLC) method of storing 4-bit data in a single memory cell MC may be set to be higher than a voltage of the read pass voltage VREAD in the TLC method.

In a read operation, a threshold voltage of a memory cell MC may increase unexpectedly due to application of a read voltage and a read pass voltage to the memory cell MC. In a description of at least one embodiment, the unexpected increase in a threshold voltage of a memory cell occurring due to the read operation will be referred to as read disturb. Hereinafter, the read disturb will be abbreviated to "RD" in some cases.

When the influence of read disturb is small, the controller 7 can perform an ECC process on read data to correct an error. In a description of at least one embodiment, an error of read data caused by the read disturb will be referred to as a read disturb error (also referred to as an error due to read disturb). When the influence of read disturb is great, the controller 7 can not correct an error even though performing an ECC process on read data.

The controller 7 rewrites data to prevent an error due to read disturb. This data rewrite operation is performed on the basis of treating the number of read operations as an amount of influence on read disturb.

Hereinafter, the data rewrite operation will also be referred to as a refresh operation. The refresh operation is an operation of copying or writing error-corrected data in the flash memory 1.

The controller 7 determines whether the refresh operation is required to be executed (including a timing for the refresh operation to be executed) based on the number of read operations executed by the flash memory 1.

The count circuit 80 counts the number of executed read operations (hereinafter, also referred to as the number of read operations) for each of a plurality of management units set in the memory cell array 18.

In the memory system of at least one embodiment, the count circuit 80 has the following configuration.

<Configuration Example of Count Circuit>

Figure 6:
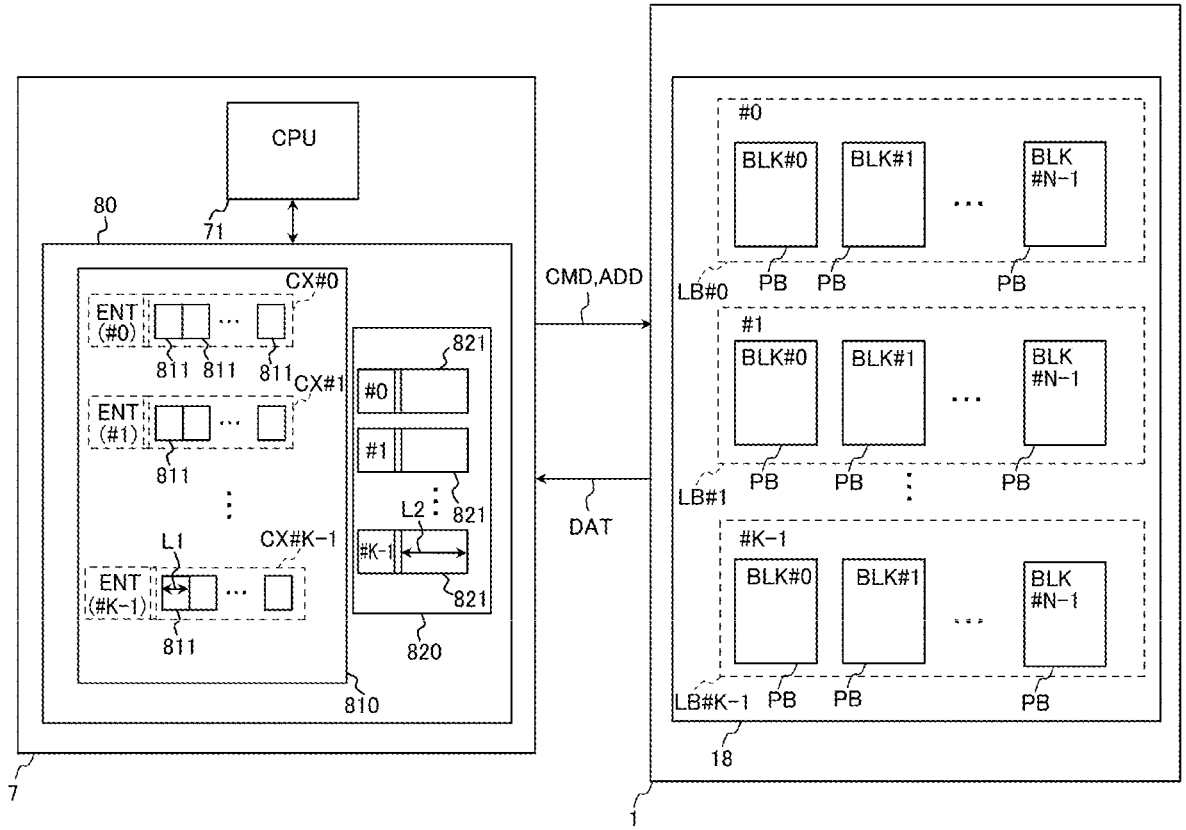
FIG. 6 is a diagram illustrating a configuration example of the memory system of the first embodiment.

With reference to FIG. 6, a configuration example of the count circuit of the controller 7 in the memory system of at least one embodiment will be illustrated.

FIG. 6 is a diagram illustrating a configuration of the count circuit of the controller 7 in the memory system of the present embodiment.

As illustrated in FIG. 6, in the memory system of the present embodiment, the NAND flash memory 1 includes a plurality of (for example, K where K is a natural number of one or greater) logical blocks LB and a plurality of (for example, M where M is a natural number of one or greater) physical blocks PB.

The logical block LB is set for the memory cell array 18.

Any number (for example, N where N is a natural number of one or greater and of M or smaller) of physical blocks PB may be allocated to each logical block LB. The number of physical blocks PB allocated to each logical block LB may be or not be the same.

In at least one embodiment, the count circuit 80 counts the number of read operations to the NAND flash memory 1, and stores the count result (hereinafter, also referred to as count information).

The count circuit 80 counts the number of times of read operation for each logical block LB and the number of times of read operation for each physical block PB.

The controller 7 determines whether a refresh operation is required to be executed on the flash memory 1 based on the count information in the count circuit 80. When it is determined that the refresh operation is required to be executed, the controller 7 executes the refresh operation on the flash memory 1. Through the refresh operation, the controller 7 reads some data from the flash memory 1, and writes data corrected by performing an ECC process on the read data, into the flash memory 1. In this case, the read data and the write data may be data of a single physical block, and may be data of a single logical block.

In at least one embodiment, the count circuit 80 has a hierarchical structure including a first counter 810 and a second counter 820 as illustrated in FIG. 6.

The first counter 810 counts the number of executed read operations for each physical block PB. The first counter 810 stores a value of the number of read operations (hereinafter, also referred to as a count value). The first counter 810 has a first storage capacity.

The first counter 810 has a plurality of count registers 811 respectively corresponding to a plurality of physical blocks PB. The number of count registers 811 is the same as the number of physical blocks PB of the NAND flash memory 1.

Each count register 811 may store data of a first data size (for example, a data length) L1 as the number of read operations. For example, each count register 811 may store 1-bit data as the number of read operations on the corresponding physical block PB. In this case, the first storage capacity is indicated by 1×M bits.

The first counter 810 may include a plurality of counter groups CX (for example, CX #0, CX #1, ..., and CX #K−1). The counter groups CX are respectively associated with the logical blocks LB (for example, LB #0, LB #1, ..., and LB #k−1) set in the flash memory 1. The number of counter groups CX is the same as the number of logical blocks LB. Each counter group CX is configured with a plurality of count registers 811 corresponding to the plurality of physical blocks PB belonging to each logical block LB. For example, the counter group CX #m (where m is an integer of zero or greater) corresponds to the logical block LB #m.

The first counter 810 has an entry ENT related to each of the plurality of logical blocks LB. A single entry ENT is data configured with values of the plurality of count registers 811 respectively corresponding to the plurality of physical blocks. Hereinafter, data stored in the count register 811 (that is, an entry related to the physical block PB) will be referred to as an entry unit. The single entry ENT is configured with a plurality of entry units. The single entry ENT corresponds to data expressed with the single counter group CX.

The second counter 820 counts the number of executed read operations for each logical block LB. The second counter 820 stores the number of read operations (also referred to as a count value). The second counter 820 has a second storage capacity. The second storage capacity is equal to or less than the first storage capacity.

For example, the second counter 820 has a plurality of count registers 821 respectively corresponding to the plurality of logical blocks LB. The number of count registers 821 is the same as the number of logical blocks LB.

Each count register 821 may store data of a second data size (for example, a data length) L2 as the number of read operations. For example, each count register 821 may store 32-bit data as the number of read operations on the corresponding logical block LB. In this case, the second storage capacity is indicated by 32×K bits.

An entry related to a logical block LB in the second counter 820 is data configured with a value of the corresponding count register (that is, an entry) 821.

When a count value of a certain count register 811 in a certain counter group CX of the first counter 810 reaches a threshold value to overflow (or when the count value is determined as overflowing), a count value of the second counter 820 is updated. In this case, the count value of the second counter 820 is updated based on a value of the first counter 810 before overflowing (that is, the above-described threshold value). For example, a count value stored in the count register 821 corresponding to the counter group CX (this may correspond to a sum of the numbers of read operations on the plurality of physical blocks PB belonging to a certain logical block LB) is counted up due to overflowing of a count value of the counter group CX.

An operation of the count circuit 80 may be controlled by the processor 71. The processor 71 stores a plurality of threshold values. The threshold values are used as criteria for control of the counters 810 and 820, and for execution of a refresh operation. Threshold values (for example, threshold values ThrP and ThrL which will be described later) for the counters 810 and 820 are set before or during the use of the memory system SYM according to read disturb characteristics.

The count circuit 80 may include a control circuit controlling operations of the first and second counters 810 and 820. The count circuit 80 may be a circuit provided in the processor 71. The substantially same function as that of the count circuit 80 may be achieved by the processor 71 executing software (that is, a program).

In the following description, a unit for counting the number of read operations (for example, a control unit, a management unit, or an access unit) will be referred to as an RD count target unit (or simply referred to as a count target unit). In at least one embodiment, the logical block LB and the physical block PB are RD a count target unit respectively.

Hereinafter, the first counter 810 will also be referred to as a fine counter 810, and the second counter 820 will also be referred to as a coarse counter 820.

(b) Operation Example

With reference to FIGS. 7 to 10C, an operation example of the memory system of at least one embodiment will be described.

FIG. 7 is a flowchart of an operation example of the memory system of at least one embodiment. FIGS. 8A to 10C are schematic diagrams illustrating an operation example of the memory system of at least one embodiment. In description of the operation example of the memory system of at least one embodiment, FIGS. 1 to 6 will also be referred to as appropriate.

<S200>

As illustrated in FIG. 7, the host device 9 issues a host command related to data read to the memory system SYM, and instructs the controller 7 to read data. The host device 9 sends a logical address of the data to be read to the controller 7.

The controller 7 issues a controller command CMD for reading data (hereinafter, referred to as a read command) based on the host command from the host device 9.

The controller 7 acquires a physical address of the NAND flash memory 1 in which the desired data is stored, based on the logical address received from the host device 9. The processor 71 refers to the management table in the RAM 74, and acquires an address of a logical block associated with the data and an address of a physical block in which the data is stored. For example, based on the logical address, an ID of a logical block (hereinafter, referred to as a selected logical block) LB<i>, and an ID of a corresponding physical block (hereinafter, referred to as a selected physical block) PB<j> among the plurality of physical blocks PB are obtained, where i and j are a natural number of zero or greater respectively.

The controller 7 sends the read command CMD and a physical address ADD to the flash memory 1.

The flash memory 1 receives the read command CMD and the physical address ADD. The flash memory 1 executes a read operation on a region (hereinafter, referred to as a read region) in the selected physical block PB corresponding to the physical address ADD based on the read command CMD (S100).

The flash memory 1 sends data read through the read operation to the controller 7 (S101). The controller 7 sends the received data to the host device 9.

<S201>

In the controller 7, an operation of counting the number of read operations is executed by the count circuit 80 in parallel to, for example, a read operation of the flash memory 1.

Figure 8A:
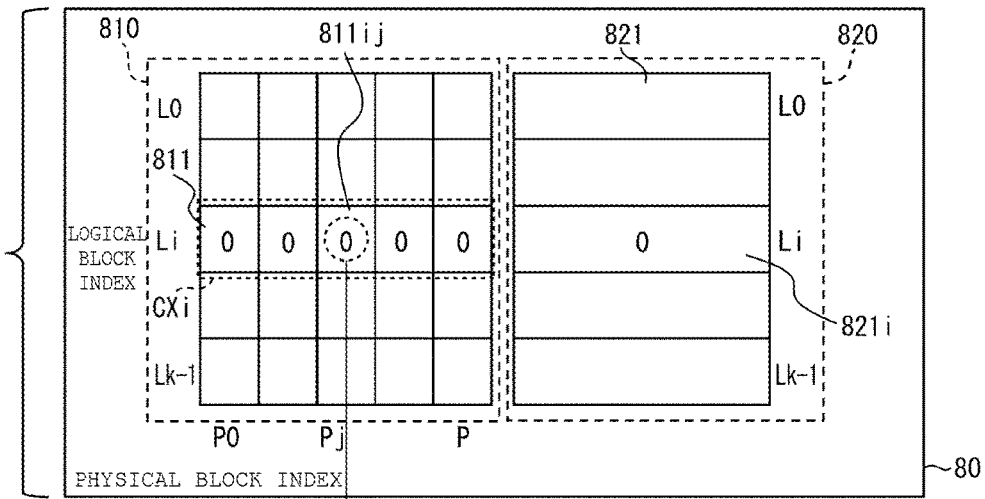
FIGS. 8A and 8B are diagrams illustrating an operation example of the memory system of the first embodiment.
Figure 8B:
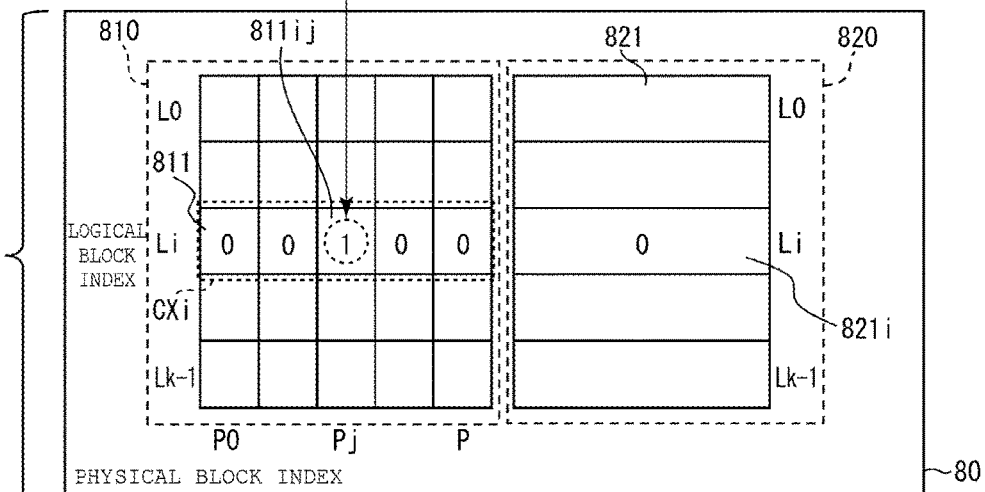

As illustrated in FIGS. 8A and 8B, the processor 71 updates (for example, counts up) a value in the count register 811$ij$ of the fine counter 810 corresponding to the selected physical block PB<j> of the selected logical block LB<i>.

In the fine counter 810, "1" is added to a value stored in the corresponding count register 811$ij$. When the value in the count register 811$ij$ is "0", the value in the count register 811$ij$ is changed from "0" to "1".

As illustrated in FIGS. 8A and 8B, in the counter group CXi corresponding to the selected logical block LB<i>, when a value in the count register 811$ij$ corresponding to the selected physical block PB<j> does not overflow, the value in the count register 811$ij$ is maintained at "1". In this case, a value in the count register 821$i$ corresponding to the selected logical block LB<i> is not updated.

Figure 9A:
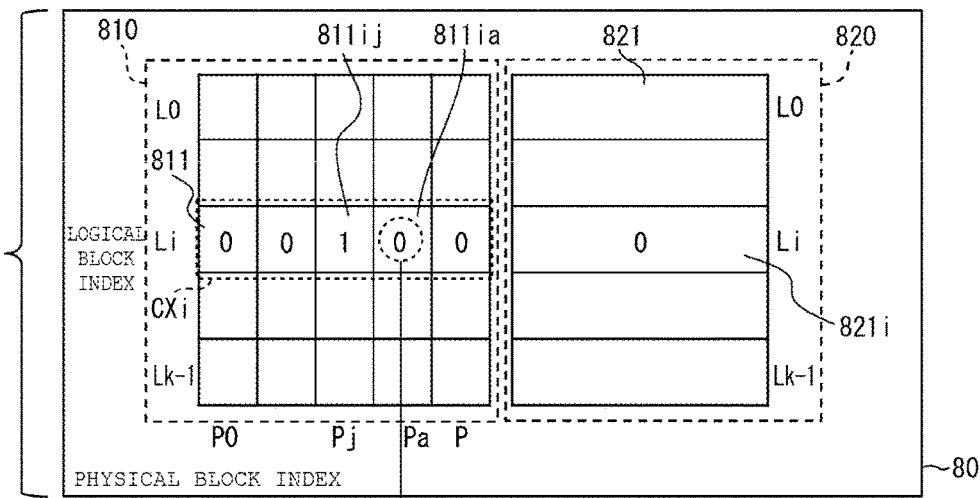
FIGS. 9A and 9B are diagrams illustrating an operation example of the memory system of the first embodiment.
Figure 9B:
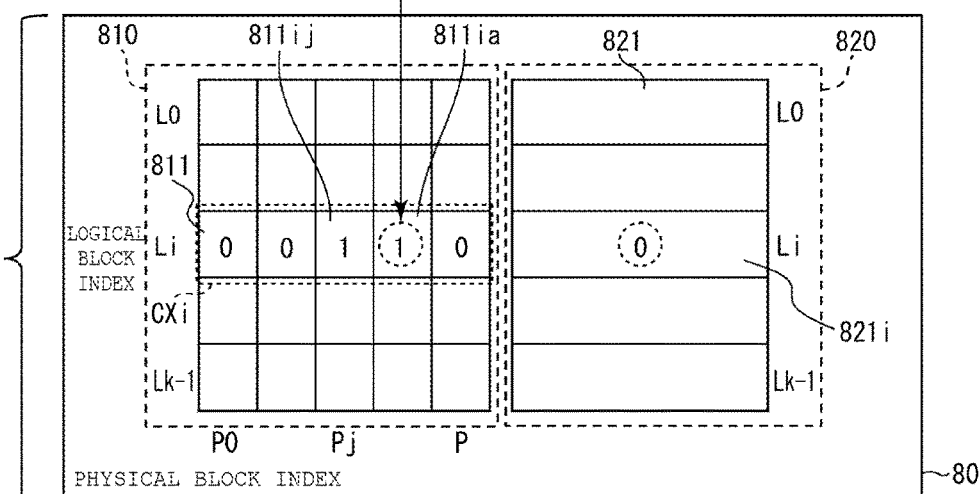

FIGS. 9A and 9B are schematic diagrams illustrating a state of the fine counter when the next read region is a physical block PB<a> belonging to the logical block LB<i>.

As illustrated in FIGS. 9A and 9B, when a value in the count register 811$ia$ corresponding to the physical block PB<a> that is a read operation target does not overflow even though a read operation is executed on the physical block PB<a> belonging to the same logical block LB<i> as that of the physical block PB<j>, a value in the count register 821$i$ is not updated.

<S202>

The processor 71 determines whether a value in the count register 811 corresponding to the selected physical block PB of the selected logical block LB reaches the threshold value ThrP related to the number of read operations on the physical block PB.

When the value in the count register 811 does not reach the threshold value ThrP (that is, in a case of False in S202 in FIG. 7), the processor 71 finishes the process in the count circuit 80 corresponding to the issued read command.

Figure 10A:
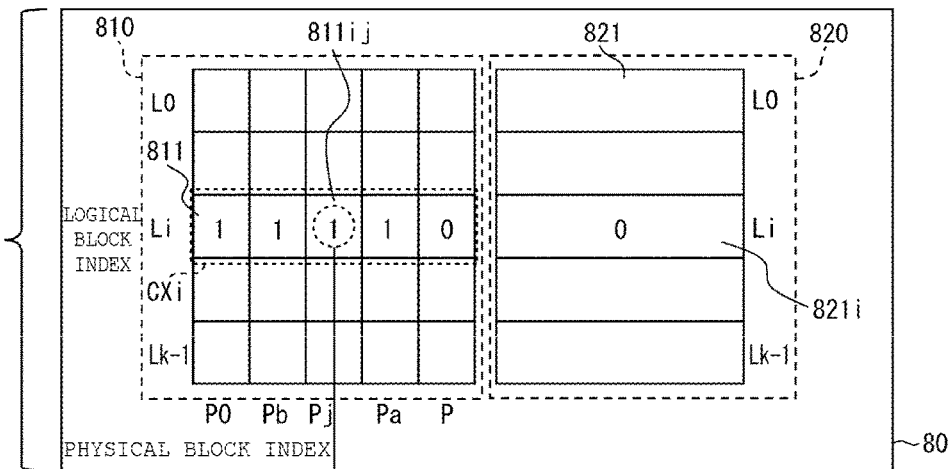
FIGS. 10A to 10C are diagrams illustrating an operation example of the memory system of the first embodiment.
Figure 10B:
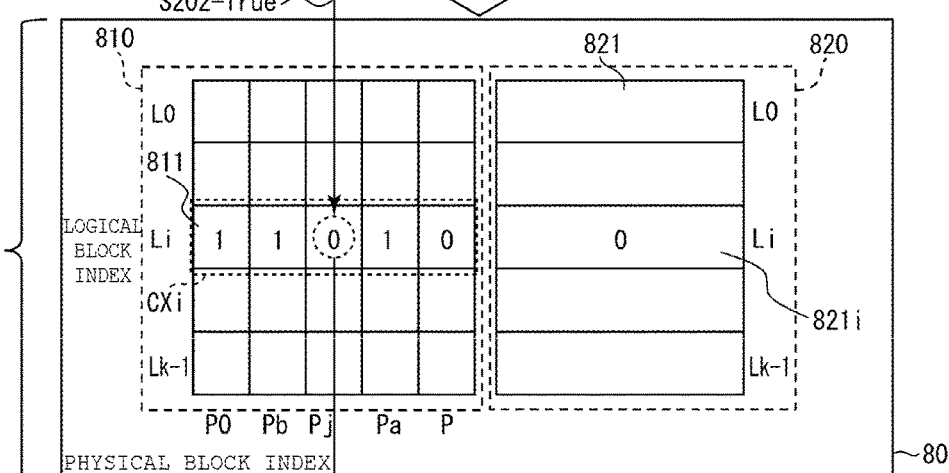
Figure 10C:
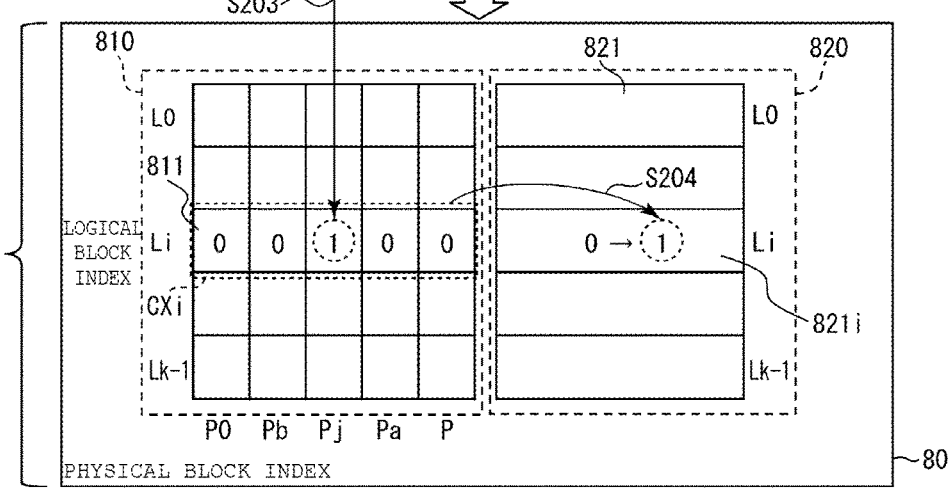

FIGS. 10A to 10C are schematic diagrams illustrating a state of the fine counter when the next read region is a physical block PB<j> belonging to the logical block LB<i>.

As illustrated in FIG. 10A, when a read operation is executed on the physical blocks PB<0> and PB<b> belonging to the logical block LB<i>, values in the corresponding count registers 811 are updated.

Thereafter, a case is supposed in which the physical block PB<j> belonging to the logical block LB<i> is selected as a read operation target.

Here, when a value in the count register 811$ij$ reaches the threshold value ThrP (that is, in a case of True in S202 in FIG. 7), the processor 71 determines that the value in the count register 811$ij$ overflows.

<S203>

As illustrated in FIG. 10B, when the value in the count register 811$ij$ reaches the threshold value ThrP, the processor 71 resets the value in the count register 811$ij$.

As illustrated in FIG. 10C, the processor 71 resets values in the other count registers 811 corresponding to the selected logical block LB<i> along with the reset of the count register 811$ij$.

Consequently, in the fine counter 810, a value in each count register 811 of the counter group CXi corresponding to the selected logical block LB<i> is set to "0".

After the count register 811 is reset, the processor 71 sets a value in the count register 811$ij$ to "1".

<S204>

The processor 71 counts up a value in the count register 821$i$ of the coarse counter 820 corresponding to the selected logical block LB<i> by "ThrP−1". When the threshold value ThrP is "2", "1 (=2−1)" is added to the value (herein, "0") in the count register 821$i$.

Note that when a value in the fine counter 810 reaches the threshold value ThrP, a value in the count register 821 may be counted up by a value of "ThrP" (for example, "2").

<S205>

The processor 71 determines whether the counted-up value in the count register 821$i$ of the coarse counter 820 reaches the threshold value ThrL related to the number of read operations on the logical block LB.

When the value in the count register 821$i$ does not reach the threshold value ThrL (that is, in a case of False in S205 in FIG. 7), the processor 71 finishes the process in the count circuit 80 corresponding to the issued read command.

<S206>

When the value in the count register 821$i$ reaches the threshold value ThrL (that is, in a case of True in S205 in FIG. 7), the processor 71 executes an over-threshold process on the selected logical block LB<i> for which the value in the count register 821$i$ reaches the threshold value ThrL. The over-threshold process in the present embodiment is a process for determining whether copying and/or rewriting of corrected data (that is, the refresh operation) are (is) to be executed when a count value for the number of read operations in the coarse counter 820 is equal to or greater than a threshold value.

The over-threshold process and the refresh operation are executed by the controller 7 and the flash memory 1 without a host command from the host device 9.

The controller 7 causes the flash memory 1 to execute the over-threshold process as follows.

Hereinafter, with reference to FIGS. 11 and 12, the over-threshold process and the refresh operation executed in the memory system of the present embodiment will be described.

<Over-threshold Process>

Figure 11:
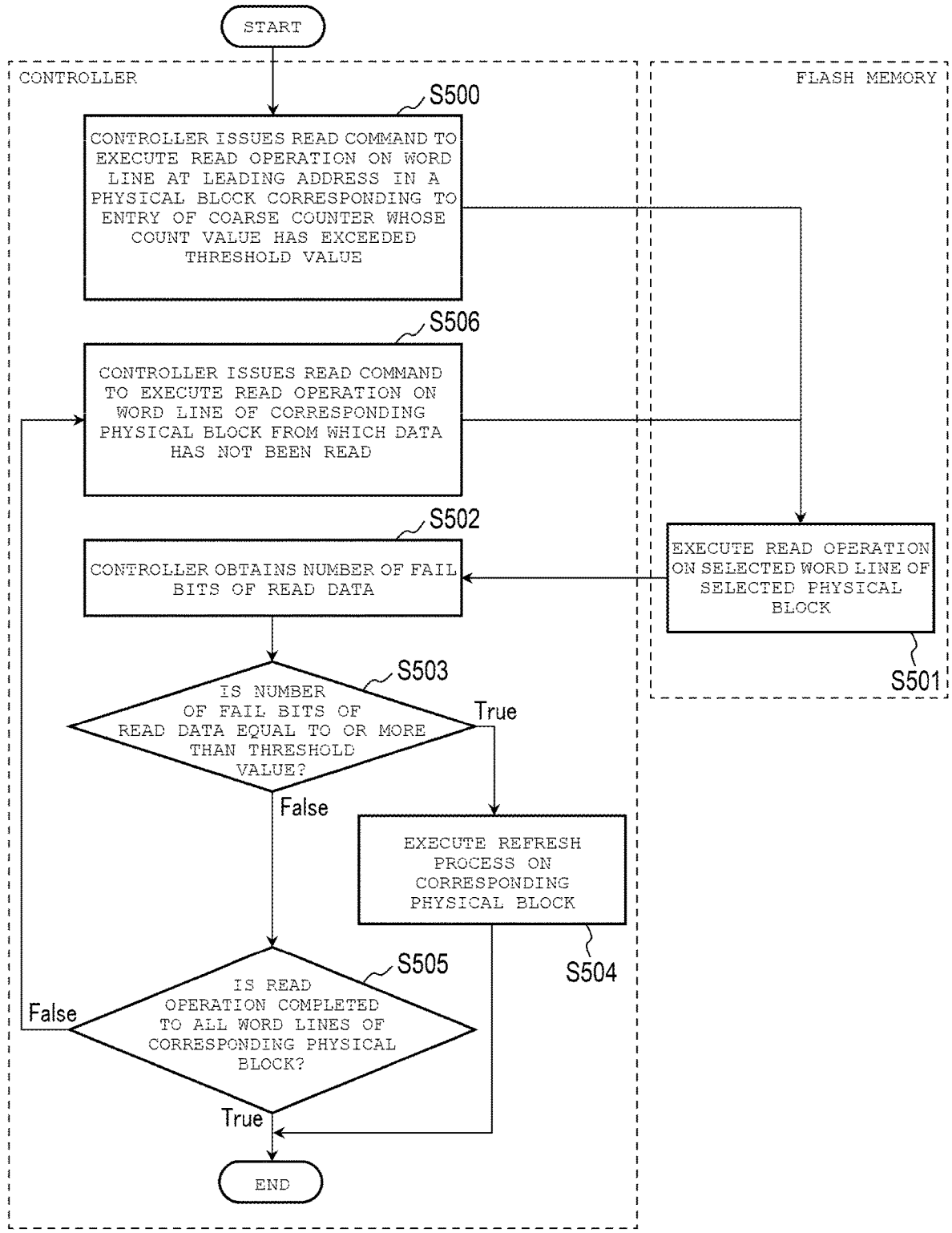
FIG. 11 is a flowchart of an operation example of the memory system of the first embodiment.

FIG. 11 is a flowchart of examples of the over-threshold process and the refresh operation executed in the memory system of at least one embodiment.

As illustrated in FIG. 11, in the over-threshold process, the memory system SYM of at least one embodiment determines whether data rewrite operation (that is, the refresh operation) is to be executed based on, for example, the number of fail bits.

<S500>

For example, when the over-threshold process is determined to be executed based on the number of read operations counted by the plurality of hierarchical counters (S205 in FIG. 7), the controller 7 issues a read command to execute a read operation on a word line at a leading address in a physical block belonging to an entry of the coarse counter 820 whose count value has exceeded the threshold value. The read command and an address are sent to the flash memory 1.

<S501>

The flash memory 1 executes a read operation on the selected word line WL of the selected physical block PB based on the read command and the address. Hereinafter, the read operation in the over-threshold process (in other words, the read operation for the refresh operation) will be referred to as a scan read operation.

The flash memory 1 sends read data to the controller 7.

<S502>

The controller 7 performs an ECC process on the read data to count fail bits. Consequently, the controller 7 obtains the number of fail bits of the read data.

<S503>

The controller 7 determines whether the number of fail bits of the read data is equal to or more than a threshold value (hereinafter, referred to as a fail bit threshold value) ThrFBC set for the number of fail bits.

<S504>

When the number of fail bits is equal to or more than the fail bit threshold value ThrFBC (that is, True in S503 in FIG. 11), the controller 7 executes a refresh process on the corresponding physical block PB.

In the refresh process on the corresponding physical block PB, the controller 7 copies all data in a refresh process target physical block PB to another physical block PB that is different from the refresh process target physical block PB. Hereinafter, the refresh process target physical block PB will be referred to as a refresh target block.

The data copy is executed by the controller 7 as follows.

The controller 7 reads data in the refresh target block in a unit of a word line. The controller 7 corrects an error by performing an ECC process on the read data. Various error correction processes are executed until the error of the read data is corrected. The controller 7 writes the error-corrected data into another physical block that is different from the refresh target block. The controller 7 executes a data copy process on all word lines in the refresh target block. The data copy process includes a read operation, an ECC process on the read data, and writing of the error-corrected data into another physical block PB.

The controller 7 finishes the over-threshold process after the refresh operation in the flash memory 1 is completed.

<S505>

When the number of fail bits is less than the threshold value ThrFBC (that is, False in S503 in FIG. 11), the controller 7 determines whether a read operation is completed to all word lines WL of the selected physical block PB.

When the read operation is completed to all word lines WL of the selected physical block PB (that is, True in S505 in FIG. 11), the controller 7 finishes the over-threshold process.

<S506>

When the read operation is not completed to all word lines WL of the selected physical block PB (that is, False in S505 in FIG. 11), the controller 7 issues a read command to execute a read operation on a non-selected word line WL (that is, a word line WL on which a read operation has not been executed in the over-threshold process) of the corresponding physical block PB.

Thereafter, the controller 7 repeatedly executes the processes of S501 to S506 until the refresh process is completed or reading of all word lines WL of the corresponding physical block PB is completed.

As described above, the memory system of at least one embodiment can execute the over-threshold process.

In the example illustrated in FIG. 11, the controller 7 executes the processes of S500 to S506 on all of the physical blocks PB belonging to an entry of the coarse counter 820 whose count value has exceeded the threshold value.

Figure 12:
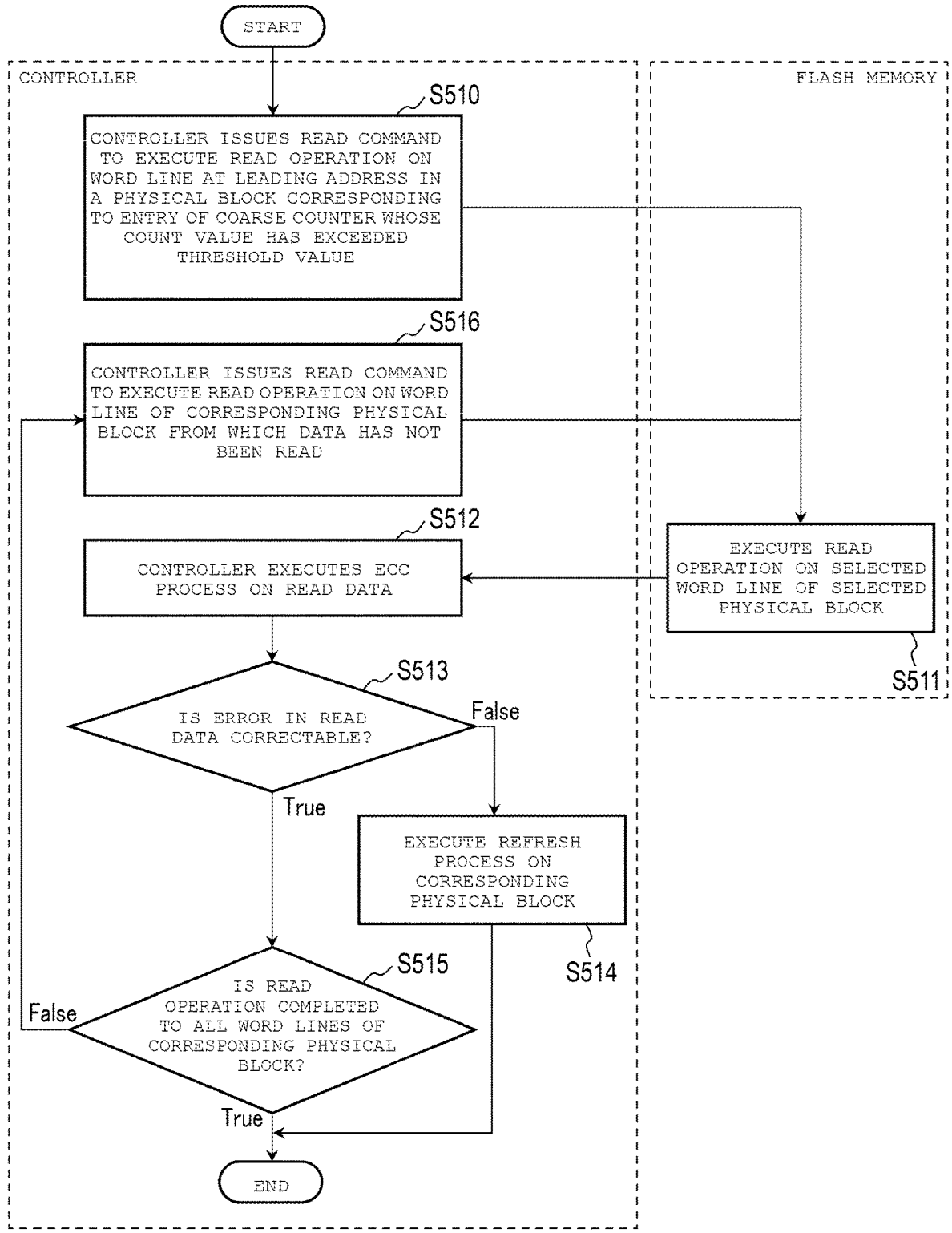
FIG. 12 is a flowchart of an operation example of the memory system of the first embodiment.

In the memory system of at least one embodiment, the over-threshold process may be executed through a process as illustrated in FIG. 12.

FIG. 12 is a flowchart of other examples of the over-threshold process and the refresh operation executed in the memory system of at least one embodiment.

As illustrated in FIG. 12, in the over-threshold process, the memory system. SYM of at least one embodiment may determine whether data copy is to be executed based on whether error correction through an ECC process is successful. For example, when the memory system SYM can perform a plurality of ECC processes with different correction capabilities, the ECC processes are performed stepwise, and data copy is executed. In this case, it is determined whether data copy is to be executed based on whether error correction is successful through a high-speed ECC process with low correction capability. An ECC process with high correction capability is executed in the refresh process.

<S510 and S511>

In the same manner as in the example illustrated in FIG. 11, the controller 7 issues a read command and an address to the flash memory 1, and then the flash memory 1 executes a read operation on the selected word line WL in the selected block PB based on the read command.

The flash memory 1 sends read data to the controller 7.

<S512>

The controller 7 executes an ECC process on the read data.

<S513>

The controller 7 determines whether an error in the read data is corrected through the ECC process.

<S514>

When an error in the read data is not corrected (that is, False in S513 in FIG. 12), the controller 7 executes a refresh operation on the corresponding block in the same manner as in step S504 of the example illustrated in FIG. 11. The controller 7 finishes the over-threshold process after the refresh operation is completed.

<S515>

When an error in the read data is corrected through the ECC process (that is, True in S513 in FIG. 12), the controller 7 determines whether a read operation is completed to all word lines WL of the corresponding physical block PB.

When the read operation is completed to all word lines WL of the selected physical block PB (that is, True in S515 in FIG. 12), the controller 7 finishes the over-threshold process.

<S516>

When the read operation is not completed to all word lines WL of the selected physical block PB (that is, False in S515 in FIG. 12), the controller 7 issues a read command to execute a data read operation on a word line WL of the corresponding physical block PB on which a read operation has not been executed in the over-threshold process in the same manner as in the example illustrated in FIG. 11.

Thereafter, the controller 7 repeatedly executes the processes of S511 to S516 until the refresh process is completed or reading of all word lines WL of the corresponding physical block PB is completed.

In the example illustrated in FIG. 12, in the same manner as in the example illustrated in FIG. 11, the controller 7 executes the processes in S510 to S516 on all of the physical blocks PB belonging to an entry of the coarse counter 820 whose count value has exceeded the threshold value.

As described above, the memory system of at least one embodiment can execute the over-threshold process.

In the memory system of at least one embodiment, the refresh operation may be executed without determining the number of fail bits as illustrated in FIG. 11 and without determining whether an error is corrected through an ECC process as illustrated in FIG. 12.

In the memory system of at least one embodiment, a refresh operation including data copy or data rewrite may be executed on any physical block in a selected logical block.

A write operation and an erase operation of the flash memory in the memory system of at least one embodiment may be executed by using a well-known technique. Therefore, for at least one embodiment, a detailed description of the write operation and the erase operation of the flash memory in the memory system will not be repeated.

<(c) Conclusion>

In the memory system of at least one embodiment, the count circuit 80 counting the number of executed read operations of the memory device (for example, a NAND flash memory) 1 is provided in the controller 7.

In at least one embodiment, the count circuit 80 has two counters.

One counter 810 counts and stores the number of executed read operations in a first unit (for example, a physical block unit).

The other counter 820 counts and stores the number of executed read operations in a second unit (for example, a logical block unit) larger than the first unit.

The two counters 810 and 820 are hierarchical.

A count value in the counter 820 is updated according to the occurrence of overflowing in a count value in the counter 810 (for example, the count value reaching a threshold value). When the count value in the counter 820 reaches a threshold value, various operations (for example, data read, data copy, and an ECC process on data) for ensuring the reliability of data in the NAND flash memory 1 are executed.

Consequently, the memory system of at least one embodiment can reduce the influence of read disturb and thus provide data with high reliability.

The memory system of at least one embodiment can reduce the number of scan read operations monitoring the influence of read disturb.

The memory system of at least one embodiment can prevent an increase in an area of the count circuit while reducing the influence of read disturb and also ensuring the reliability of data. As a result, manufacturing cost of the memory system of at least one embodiment is reduced.

As described above, the memory system of at least one embodiment can improve performance thereof.

(2) Second Embodiment

With reference to FIGS. 13 to 16B, a memory system of a second embodiment and a control method therefor will be described.

<(a) Configuration Example>

Figure 13:
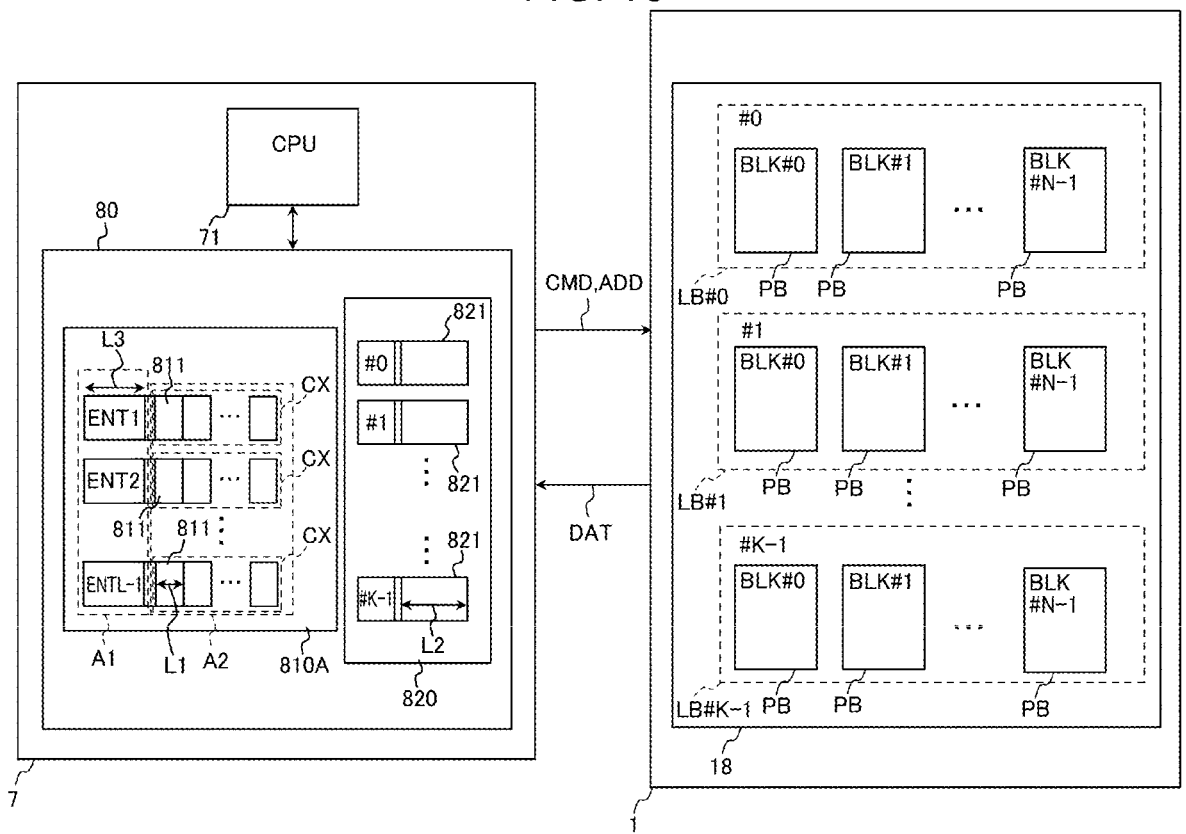
FIG. 13 is a diagram illustrating a configuration example of a memory system of a second embodiment.

With reference to FIG. 13, a configuration example of a memory system of at least one embodiment will be described.

FIG. 13 is a block diagram illustrating a configuration example of the memory system of at least one embodiment.

FIG. 13 illustrates a configuration example of a count circuit of a controller in the memory system of at least one embodiment.

A count circuit 80 illustrated in FIG. 13 includes a first counter 810A and a coarse counter 820. The first counter 810A stores the number of read operations on some of the logical blocks LB. In a description of at least one embodiment, the counter 810A storing the number of read operations on some of the logical blocks LB will be referred to as a transient counter 810A.

The transient counter 810A has storage regions (for example, registers, SRAMs, or DRAMs) A1 and A2.

In the transient counter 810A, indexes related to a plurality of logical blocks LB (for example, IDs of the logical blocks LB) are stored in the storage region A1. In the transient counter 810A, the number of read operations on a plurality of physical blocks PB belonging to each logical block LB is stored in the storage region A2.

For example, the ID (in other words, an index) of the logical block LB is data of a data size L3, and is stored in a register in the storage region A1. The number of read operations on the physical block PB is data of a data size L1, and is stored in a register (for example, a count register) 811 in the storage region A2.

As illustrated in FIG. 13, the transient counter 810A stores a plurality of (for example, (L−1) where (L−1) is a natural number smaller than K) entries ENT. In at least one embodiment, each entry ENT is data including the index related to the logical block LB and the number of read operations on each of the plurality of physical blocks PB belonging to the logical block LB.

The transient counter 810A dynamically alters the counter groups CX. For example, in the transient counter 810A, an algorithm for evicting the entry ENT employs a first-in first-out (FIFO) method.

In at least one embodiment, the transient counter 810A is used as the above-described fine counter. In at least one embodiment, the coarse counter 820 has the substantially same configuration as that in the above example (for example, illustrated in FIG. 6).

<(b) Operation Example>

With reference to FIGS. 14 to 16B, an operation example of the memory system of at least one embodiment will be described. In description of the operation of the memory system of at least one embodiment, FIGS. 1 to 13 will also be referred to as appropriate.

Figure 14:
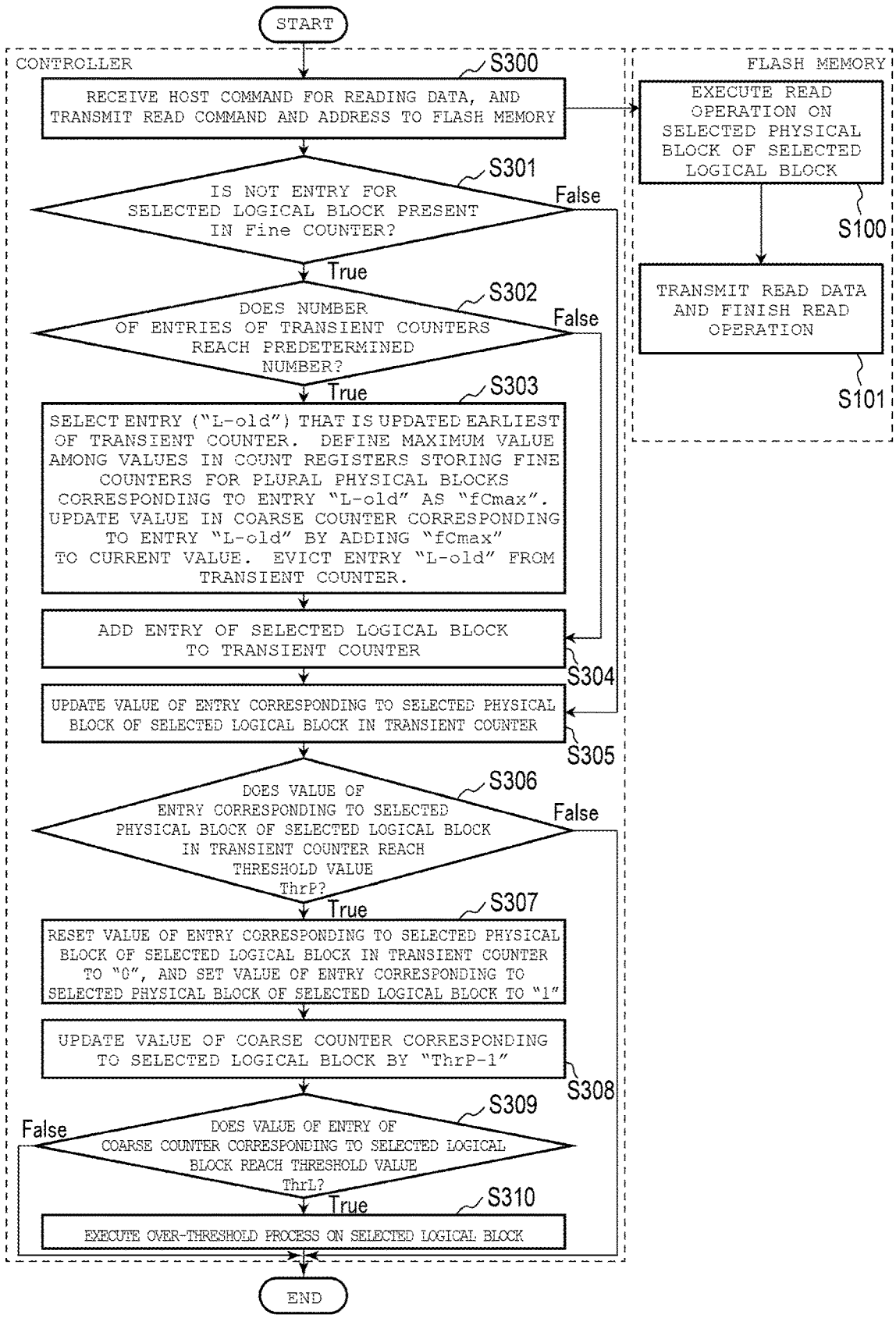
FIG. 14 is a flowchart of an operation example of the memory system of the second embodiment.

FIG. 14 is a flowchart of an operation example of the memory system of at least one embodiment. FIGS. 15A to 16B are schematic diagrams illustrating an operation example of the memory system of at least one embodiment.

Hereinafter, a case where the transient counter 810A stores two entries (for example, ENT1 and ENT2) will be described. However, the number of entries of the transient counter 810A of the count circuit 80 is not limited.

<S300>

As illustrated in FIG. 14, the controller 7 transmits a read command CMD and an address ADD to the flash memory 1 according to a host command from the host device 9 in the same manner as in the first embodiment. The flash memory 1 executes a read operation on the selected physical block PB<j> of the selected logical block LB<i> indicated by the address ADD (S100). The flash memory 1 sends read data to the controller (S101).

<S301>

The processor 71 determines whether an entry corresponding to the selected logical block LB<i> is present in the entries of the transient counter 810A.

When the entry corresponding to the selected logical block LB<i> is present in the transient counter 810A (that is, False in S301 in FIG. 14), the processor 71 executes a process of S305 in FIG. 14.

When the entry corresponding to the selected logical block LB<i> is not present in the transient counter 810A (that is, True in S301 in FIG. 14), the processor 71 executes a process of S302 in FIG. 14.

<S302>

When the entry corresponding to the selected logical block LB<i> is not present in the transient counter 810A, the processor 71 determines whether the number of entries stored in the transient counter 810A reaches a predetermined number.

When the number of entries in the transient counter 810A does not reach the predetermined number (for example, two) (that is, in a case of False in S302), the processor 71 executes the process of S304 in FIG. 14.

When the number of entries in the transient counter 810A reaches the predetermined number (that is, in a case of True in S302), the processor 71 executes the process of S303 in FIG. 14.

<S303>

Figure 15A:
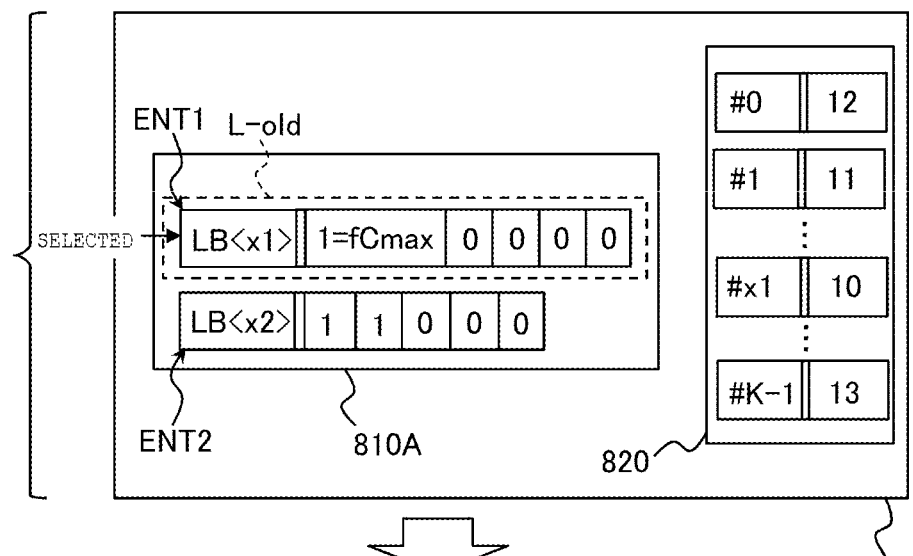
FIGS. 15A to 15C are diagrams illustrating an operation example of the memory system of the second embodiment.

The process in the case of True in S302 will be described with reference to FIGS. 15A to 15C. In FIG. 15A, a case is supposed in which all entries ENT of the transient counter 810A are used according to count processes for read operations executed before a read operation that is a target of a current count process, and the number of entries ENT of the transient counter 810A reaches a predetermined number.

When the number of entries ENT (for example, ENT1 and ENT2) of the transient counter 810A reaches a predetermined number (herein, "2"), the processor 71 selects an entry "L-old" that is updated earlier of the plurality of entries ENT1 and ENT2 of the transient counter 810A. Here, the entry ENT1 storing a counter group corresponding to a logical block ID LB<x1> is selected as "L-old".

The processor 71 defines the maximum value (herein, "1") among values in the count registers 811 storing fine counters for the physical blocks PB of the selected logical block LB<x1> in the entry "L-old", as "fCmax".

Figure 15B:
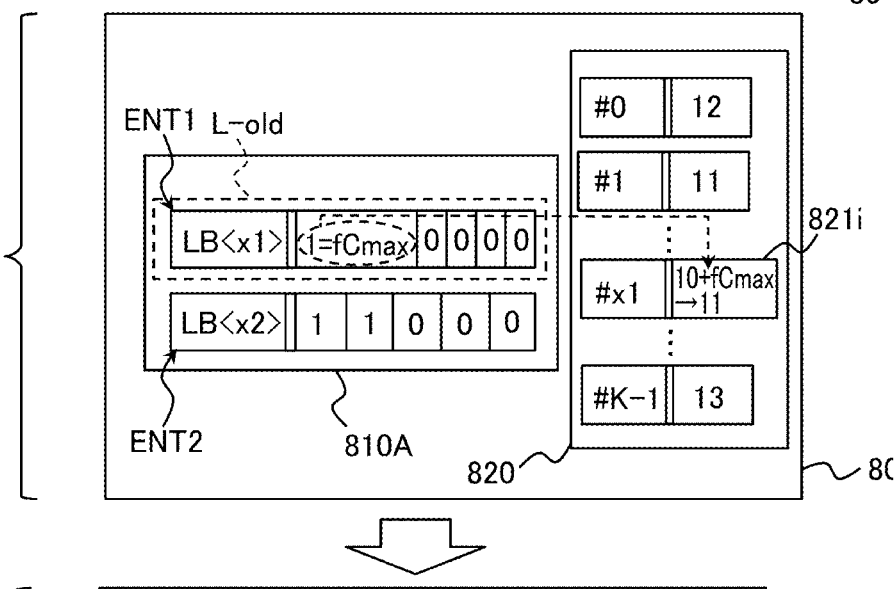
Figure 15C:
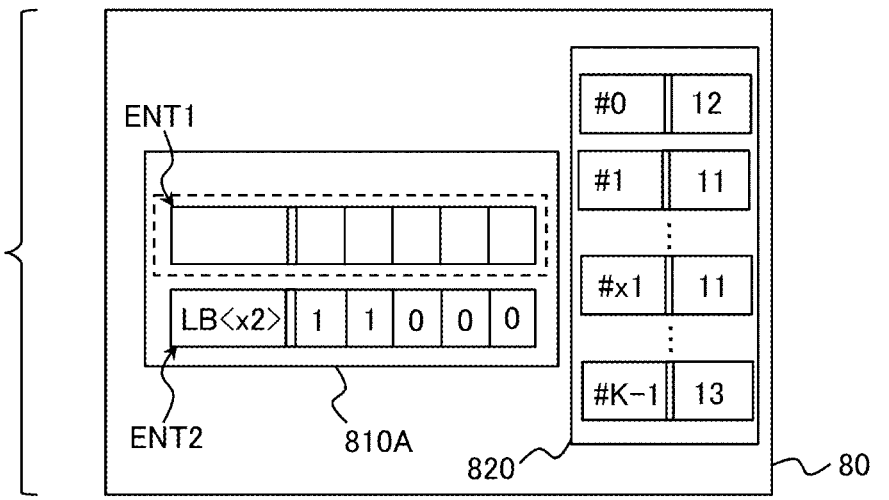

As illustrated in FIG. 15B, the coarse counter 820 updates a value in the count register 821$i$ corresponding to the selected logical block LB<x1> by adding "fCmax" to its current value (herein, "10" to "11").

The processor 71 evicts (that is, erases) the entry "L-old" from the transient counter 810A. In FIG. 15C, the entry ENT1 of the transient counter 810A becomes an available region as a result of the controller 7 evicting the entry "L-old".

Note that a value (fC) of the number of read operations on each physical block PB belonging to the logical block LB<x2> is maintained in the entry ENT2, which is related to the non-selected logical block LB<x2>.

<S304>

Figure 16A:
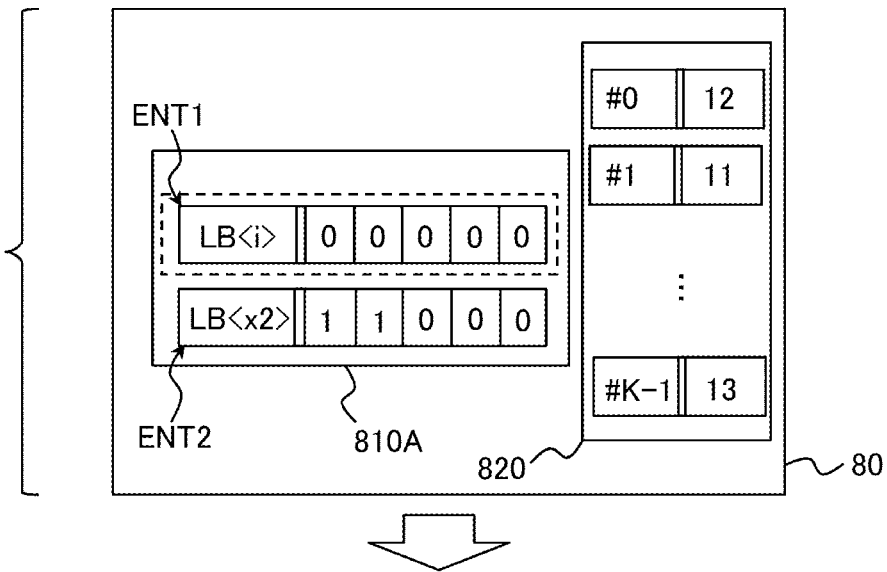
FIGS. 16A and 16B are diagrams illustrating an operation example of the memory system of the second embodiment.

As illustrated in FIG. 16A, when the number of entries of the transient counter 810A does not reach the predetermined number (that is, in a case of False in S302), or after the oldest entry "L-old" in the transient counter 810A is evicted in S303, the processor 71 adds an entry corresponding to the selected logical block LB<i> to the available region of the transient counter 810A.

As mentioned above, data in the transient counter 810A is altered from data regarding the number of read operations on a certain logical block to data related to the number of read operations on another logical block according to a change of a logical block of a read operation target.

<S305>

Figure 16B:
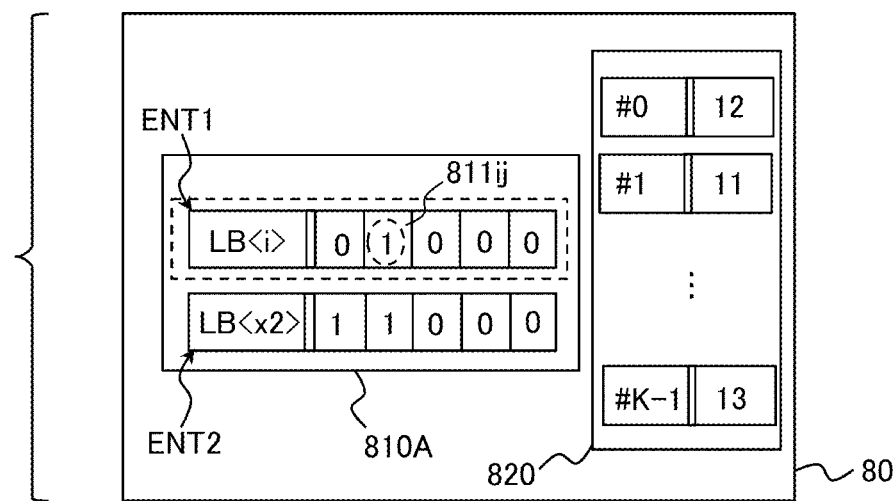

As illustrated in FIG. 16B, the processor 71 sets a value in association with the number of read operations to the entry unit of the transient counter 810A corresponding to the selected physical block PB<j> belonging to the selected logical block LB<i>. In other words, the value fCij in association with the number of read operations is set in the count register 811$ij$ with respect to the physical block PB<j> of the selected logical block LB<i>. Here, as illustrated in FIGS. 16A and 16B, a read operation is executed on the physical block PB<j> belonging to the logical block LB<i>, and thus "1" is set in the count register 811$ij$.

<S306>

Through the read operation and the count process, the processor 71 determines whether a value in any count register 811 of the corresponding entry ENT of the transient counter 810A reaches the threshold value ThrP (for example, "2") with respect to the selected physical block PB<j> of the selected logical block LB<i>.

When the value in any count register 811 of the entry ENT does not reach the threshold value ThrP (that is, in a case of False in S306), the processor 71 finishes the process.

Figure 17A:
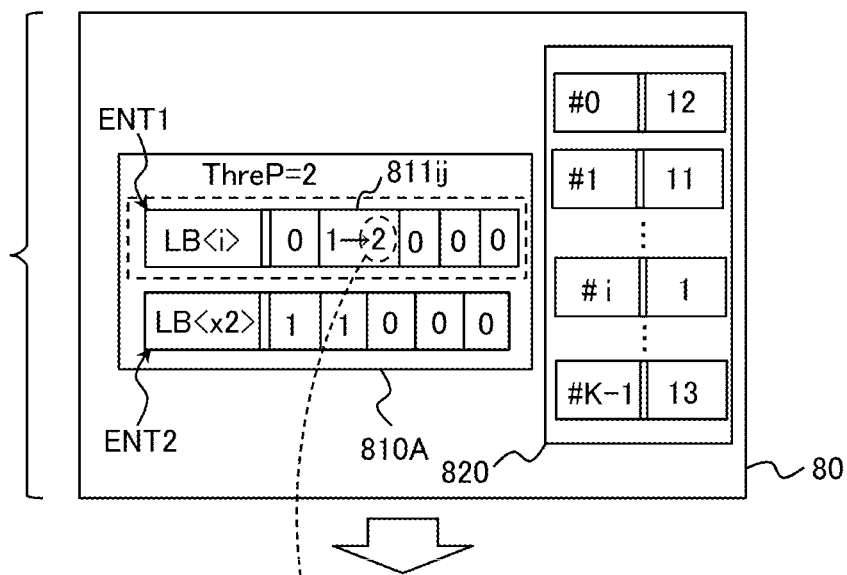
FIGS. 17A to 17C are diagrams illustrating an operation example of the memory system of the second embodiment.

As illustrated in an example of FIG. 17A, when a read operation is executed on the selected physical block PB<j> of the selected logical block LB<i>, a value in the corresponding count register 811$ij$ is updated from "1" to "2".

When the value in any count register 811 of the entry ENT reaches the threshold value ThrP (that is, in a case of True in S306) as in this case, the processor 71 determines that the value in the count register 811 of the entry ENT is in an overflowing state. The processor 71 then executes a process of S307 in FIG. 14.

<S307>

Figure 17B:
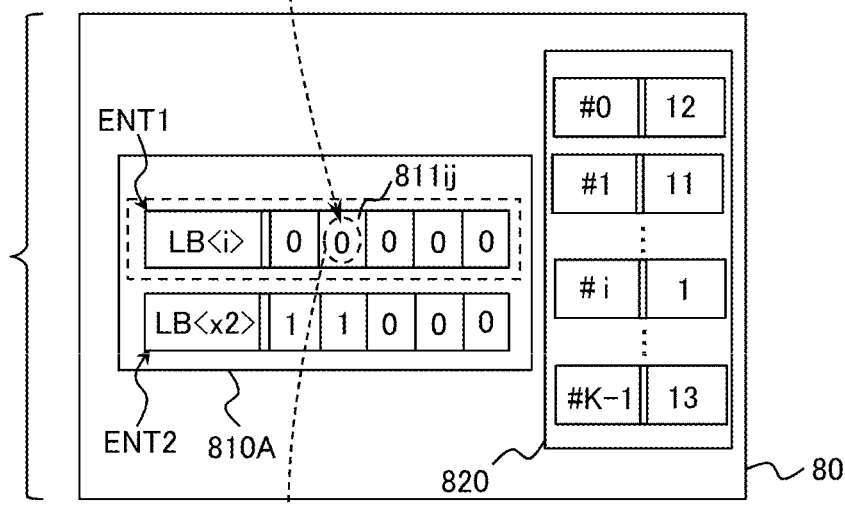

As illustrated in FIG. 17B, the processor 71 resets a value in each of the count registers 811 of the entry ENT corresponding to the selected logical block LB<i> of the transient counter 810A. Consequently, a value in the count register 811$ij$ of the entry ENT1 corresponding to the selected physical block PB<j> of the selected logical block LB<i> is set to "0".

Figure 17C:
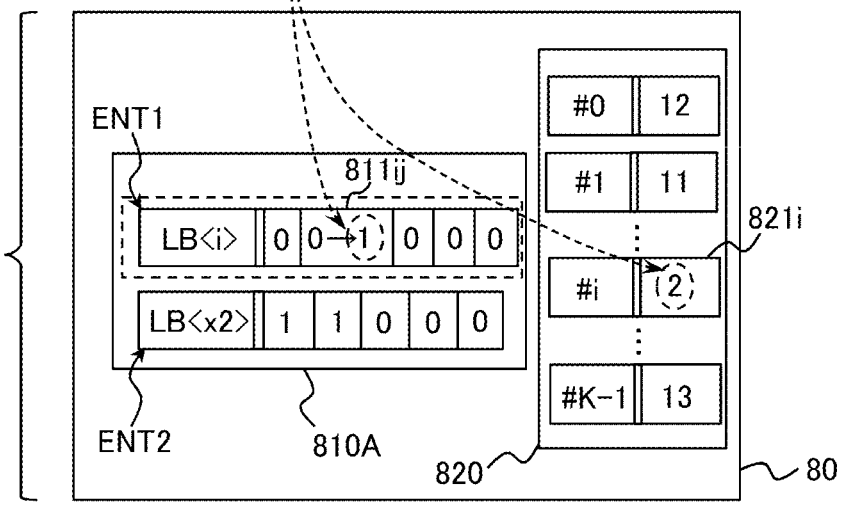

As illustrated in FIG. 17C, the processor 71 then sets a value of the entry unit (that is, the count register 811$ij$) corresponding to the selected physical block PB<j> of the selected logical block LB<i> to "1".

<S308>

In the same manner as in the example illustrated in FIG. 10, the processor 71 increases (for example, counts up) a value in the count register 821$i$ corresponding to the selected logical block LB<i> of the coarse counter 820 by "ThrP−1".

In the example illustrated in FIG. 17C, the value in the count register 821$i$ is set to "2".

<S309>

The processor 71 determines whether a value in the count register 821$i$ corresponding to the selected logical block <$i$> of the counter 820 reaches the threshold value "ThrL".

When the value in the count register 821$i$ does not reach the threshold value "ThrL" (that is, in a case of False in S309), the controller 7 finishes the count process.

When the value in the count register 821$i$ reaches the threshold value "ThrL" (that is, in a case of True in S309), the controller 7 determines that the value in the count register 821$i$ is in an overflowing state. In this case, the controller 7 executes the process of S310 in FIG. 14.

<S310>

The controller 7 executes the over-threshold process (refer to FIG. 11 or 12) on the selected logical block LB<$i$>.

As described above, in the memory system of at least one embodiment, the read operation, the count operation, and the over-threshold process are completed.

<(c) Conclusion>

In the memory system of at least one embodiment, the controller dynamically alters data stored in the count circuit from data related to a physical block belonging to a certain logical block to data related to a physical block belonging to a read target logical block according to a change of a read operation target logical block.

As in the memory system of at least one embodiment, even when the number of target logical blocks counted with the fine counter is restricted, and a counted target logical block is dynamically altered, the number of read operations executed on each of a plurality of physical blocks belonging to a logical block can be counted.

The number of logical blocks on which the number of read operations is totaled by the counter is reduced, and thus the memory system of at least one embodiment can reduce an area of the counter.

As described above, the memory system of at least one embodiment can achieve the same effect as that of the memory system of the first embodiment.

(3) Third Embodiment

Figure 18:
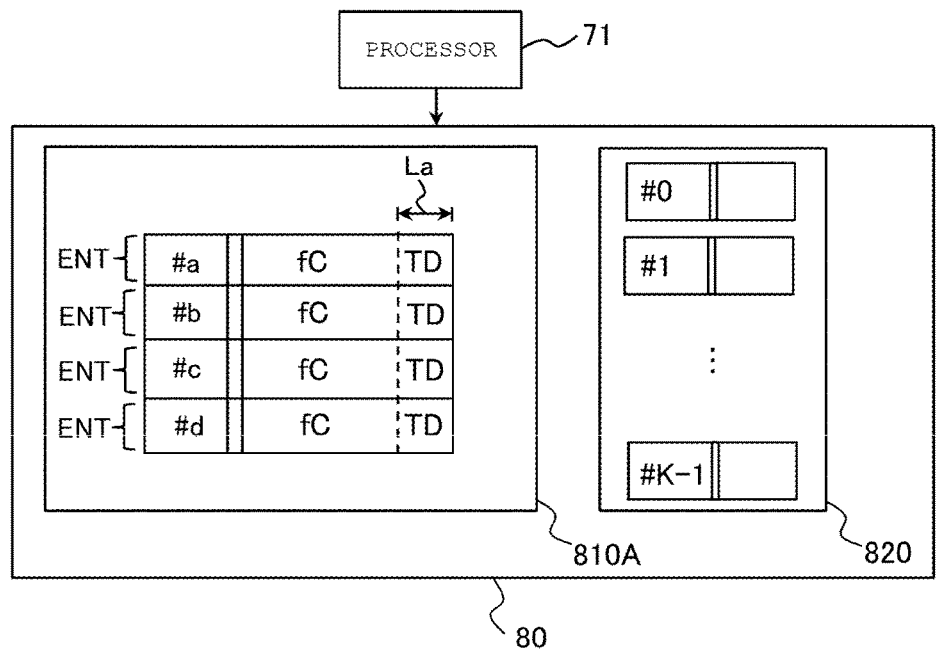
FIG. 18 is a diagram illustrating an operation example of a memory system of a third embodiment.
Figure 19:
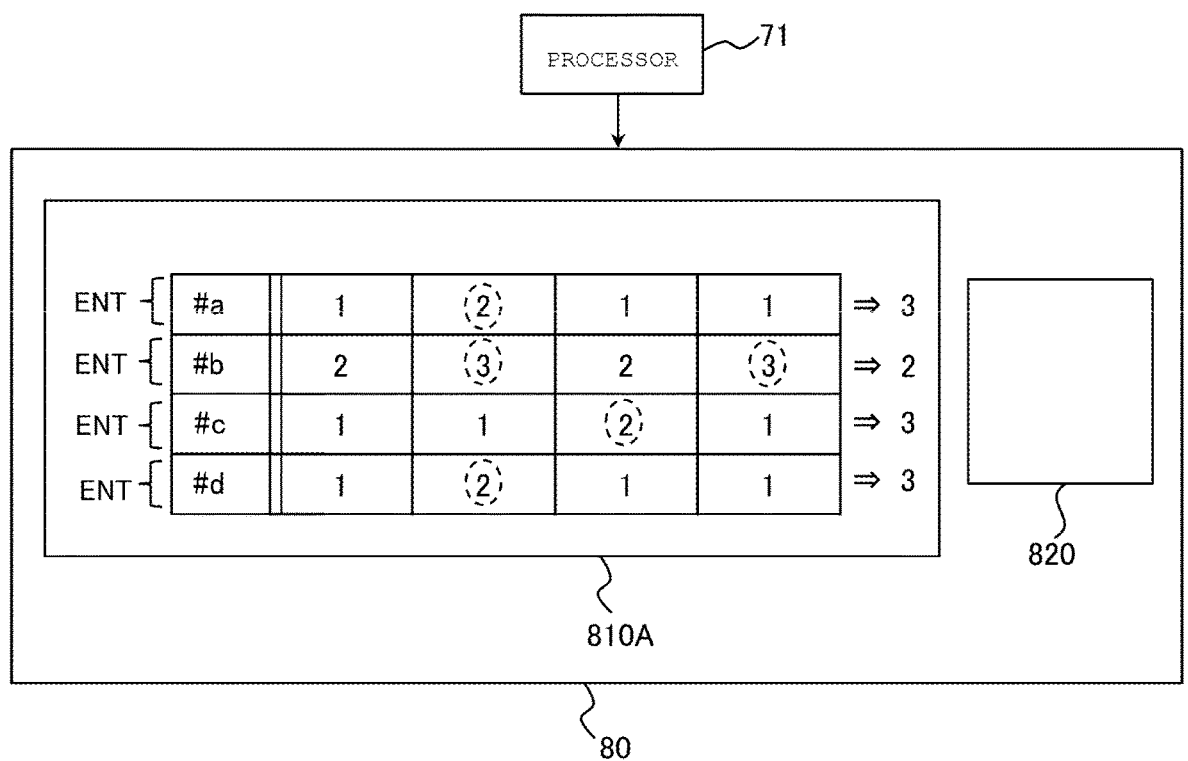
FIG. 19 is a diagram illustrating an operation example of the memory system of the third embodiment.

With reference to FIGS. 18 and 19, a memory system of a third embodiment and a control method therefor will be described.

FIGS. 18 and 19 are schematic diagrams illustrating eviction of an entry from a transient counter in the memory system of at least one embodiment.

For the second embodiment, an example was described in which the FIFO method is used as an algorithm for evicting an entry from the transient counter 810A of the count circuit 80.

However, algorithms other than the FIFO method may be applied to eviction of an entry from the transient counter 810A.

For example, a least recently used (LRU) method may be applied to an algorithm for evicting an entry from the transient counter 810A.

In eviction of an entry from the transient counter 810A using the LRU method, the processor 71 evicts the entry ENT corresponding to a logical block LB that is not used for the longest time among a plurality of entries ENT of the transient counter 810A.

As illustrated in FIG. 18, for example, in each entry ENT of the transient counter 810A, a time point at which the entry ENT is referred to last is added as time point data TD (having a size La) to data regarding the number of times of reading fC of the entry ENT.

The processor 71 (or the count circuit 80) executes an eviction process on an entry that is not used for the longest time among the plurality of entries based on the time point data TD.

Consequently, in the transient counter 810A, the eviction process on the entry ENT using the LRU method is completed.

Information regarding a use history of the entry ENT based on the time point data TD at which an entry is referred to last may be stored in the RAM 74. In this case, the processor 71 refers to the information regarding the entry use history in the RAM 74 when an entry is to be evicted.

In another example, as an algorithm for evicting an entry from the transient counter 810A, a method may be used in which a difference between a value totaled by the counters 810A and 820 and an actual number of times of read operation can be reduced.

As illustrated in FIG. 19, in this example, an entry that is a data eviction target may be determined according to, for each counter group CX, a sum of differences between the maximum value "fCmax" (that is, a value surrounded by a dotted circle in FIG. 19) among values of the count registers 811 and values in the count registers 811.

A total value (sum) of differences between the maximum value fCmax and values of the entry unit (that is, the number of read operations on each physical block PB) is computed for each entry unit.

For a the logical block LB with index #a, differences between values of each entry unit and the maximum value fCmax (that is, "2") are "1", "0", "1", and "1". A total value of the differences ($\Delta$a) is "3".

For a the logical block LB with index #b, differences between values of each entry unit and the maximum value fCmax (that is, "3") are "1", "0", "1", and "0". A total value of the differences ($\Delta$b) is "2".

For a the logical block LB with index #c, differences between values of each entry unit and the maximum value fCmax (that is, "2") are "1", "1", "0", and "1". A total value of the differences ($\Delta$c) is "3".

For a the logical block LB with index #d, differences between values of each entry unit and the maximum value fCmax (that is, "2") are "1", "0", "1", and "1". A total value of the differences ($\Delta$d) is "3".

The processor 71 (or the count circuit 80) compares the plurality of total values $\Delta$a, $\Delta$b, $\Delta$c, and $\Delta$d with each other. The processor 71 then evicts the entry ENT having the minimum value among the plurality of total values $\Delta$a, $\Delta$b, $\Delta$c, and $\Delta$d from the transient counter 810A. In the example illustrated in FIG. 19, the entry ENT corresponding to the logical block LB with the index #b is evicted.

Among the total values $\Delta$a, $\Delta$b, $\Delta$c, and $\Delta$d of the plurality of entries ENT, two or more values may be the same.

When there are a plurality of same minimum total values, the processor 71 compares, for each entry ENT among the plurality of entries ENT having the same minimum value, respective values of the plurality of entry units (for example, the count registers 811) with each other. The processor 71 may evict the entry ENT including an entry unit having the maximum value from the transient counter 810A based on the comparison result.

Further, when a plurality of entries ENT have a same minimum total value, and values of a plurality of entry units included in the plurality of entries ENT are same maximum values, the processor 71 may determine an entry ENT to be evicted based on the algorithm such as the FIFO method or the LRU method.

When the process of evicting an entry from the transient counter 810A is executed as in at least one embodiment, the memory system of at least one embodiment can achieve the same effect as in the above-described embodiments.

(4) Fourth Embodiment

A memory system of a fourth embodiment and a control method therefor will be described.

For at least one embodiment, a reset process on the count circuit 80 of the memory system will be described.

Reset processes on the counters 810 and 820 of the count circuit 80 are executed during an over-threshold process, and an erase operation on the logical block LB and/or on the physical block PB corresponding to an entry.

In the reset processes on the counters 810 and 820 during the over-threshold process, the processor 71 executes the reset process on a corresponding single entry right before or after the over-threshold process (for example, read operation to a whole physical block PB). However, the reset processes on the counters 810 and 820 may not always be executed during the over-threshold process.

In the reset processes on the counters 810 and 820 during the erase operation, the processor 71 executes the reset process according to an erase operation on the physical block PB or an erase operation on a plurality of physical blocks PB belonging to a logical block LB.

When the erase operation on the physical block PB is executed, an entry (that is, an entry unit) of the fine counter 810 is reset. In this case, only an entry unit (that is, a count register) in the fine counter 810 corresponding to the physical block PB on which the erase operation is executed is reset.

When an erase operation is executed on the logical block LB, an entry of the fine counter 810 and an entry of the coarse counter 820 are reset. In this case, entry units in the fine counter 810 corresponding to the plurality of physical blocks PB belonging to the logical block LB on which the erase operation is executed, and an entry of the coarse counter 820 corresponding to the logical block LB on which the erase operation is executed, are reset.

As described above, in the memory system of at least one embodiment, a reset process on the count circuit can be executed.

(5) Fifth Embodiment

Figure 20:
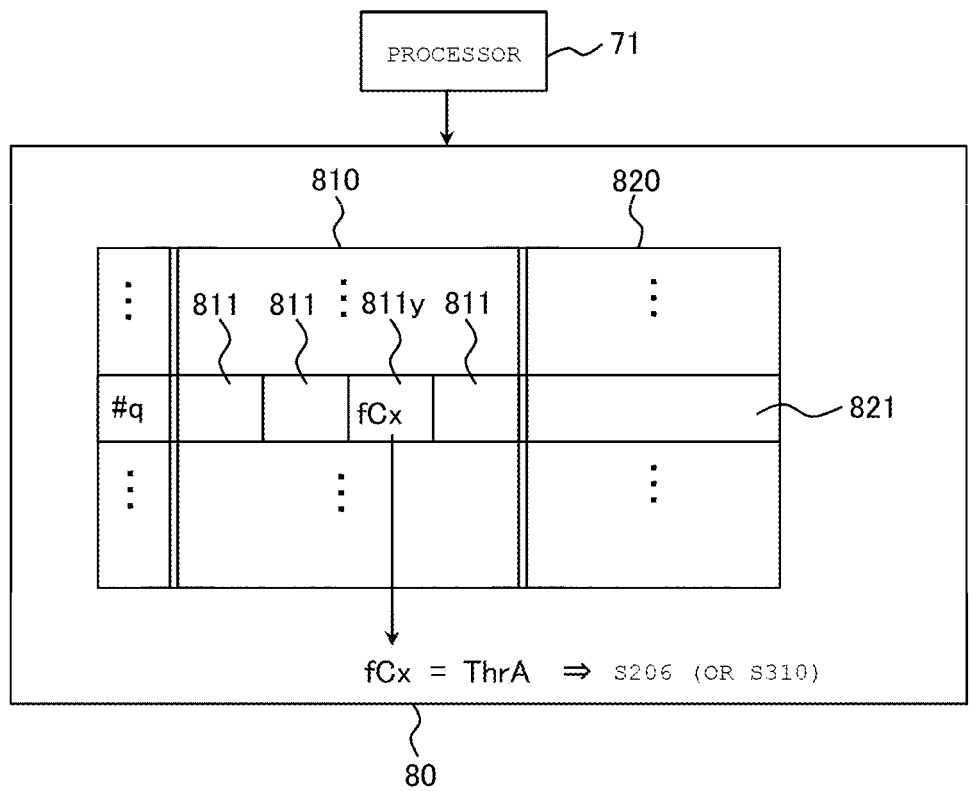
FIG. 20 is a diagram illustrating an operation example of a memory system of a fifth embodiment.
Figure 21:
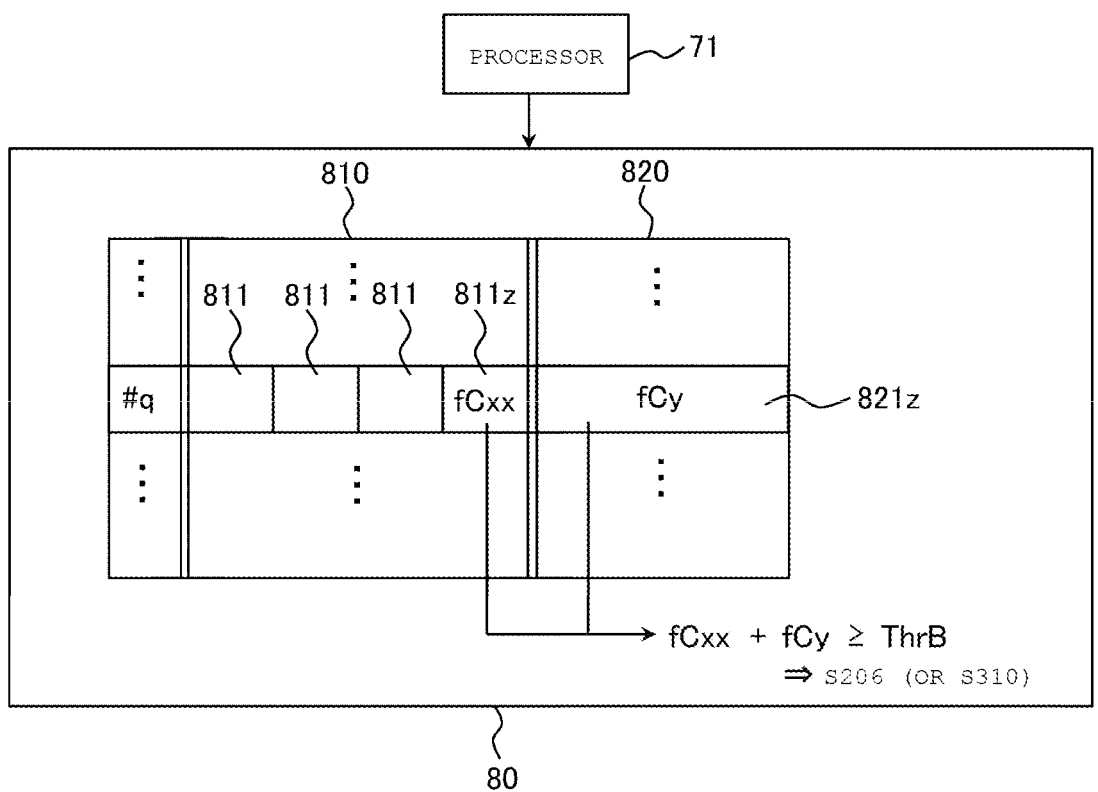
FIG. 21 is a diagram illustrating an operation example of the memory system of the fifth embodiment.

With reference to FIGS. 20 and 21, a memory system of a fifth embodiment and a control method therefor will be described.

FIGS. 20 and 21 are schematic diagrams illustrating an operation example of the memory system of the present embodiment.

In the above-described embodiments, the over-threshold process is executed when a value stored in the coarse counter 820 reaches a threshold value.

However, the over-threshold process may be executed at the following timing.

For example, as illustrated in FIG. 20, when a value fCx in a count register (that is, an entry unit) 811y reaches a threshold value ThrA in a certain entry #q of the fine counter 810, the processor 71 executes the over-threshold process on a plurality of physical blocks PB belonging to the logical block LB corresponding to the count register 811y (that is, LB #q).

In another example, as illustrated in FIG. 21, the processor 71 computes a total value of a value fCxx in a count register 811z of the fine counter 810 and a value fCy in a count register 821z of the coarse counter 820 with respect to a certain entry #q. When the total value of the value fCxx and the value fCy is equal to or greater than a threshold value ThrB, the processor 71 may execute the over-threshold process on a plurality of physical blocks PB of the logical block LB corresponding to the counters 810 and 820 (that is, LB #q).

It may also be determined whether the over-threshold process is to be started based on values of a plurality of count registers 811 and a value of the count register 821 (for example, a total value of the values of the plurality of count registers 811 and the value of the count register 821).

As described above, in the memory system of at least one embodiment, the over-threshold process can be executed.

(6) Sixth Embodiment

A memory system of a sixth embodiment and a control method therefor will be described.

In the above-described embodiments, an example has been described in which, when a value stored in the fine counter 810 is equal to or greater than a threshold value and thus overflows, a value in the coarse counter is updated. Thus, slight delay may occur before a value totaled by the fine counters is reflected in the coarse counter.

In relation to this, update of values in the counters 810 and 820 may be executed as follows.

To reduce delay between the fine counter 810 and the coarse counter 820, the maximum value in the plurality of count registers 811 of each counter group CX of the fine counter 810 may be recognized.

During update of the fine counter 810, if a value in the coarse counter 820 is updated at the same time as the maximum value of values in the plurality of count registers 811 of the counter group CX being updated, delay between update of the fine counter 810 and update of the coarse counter 820 can be reduced.

As described above, in the memory system of the embodiment, a counter update process can be executed.

(7) Seventh Embodiment

Figure 22:
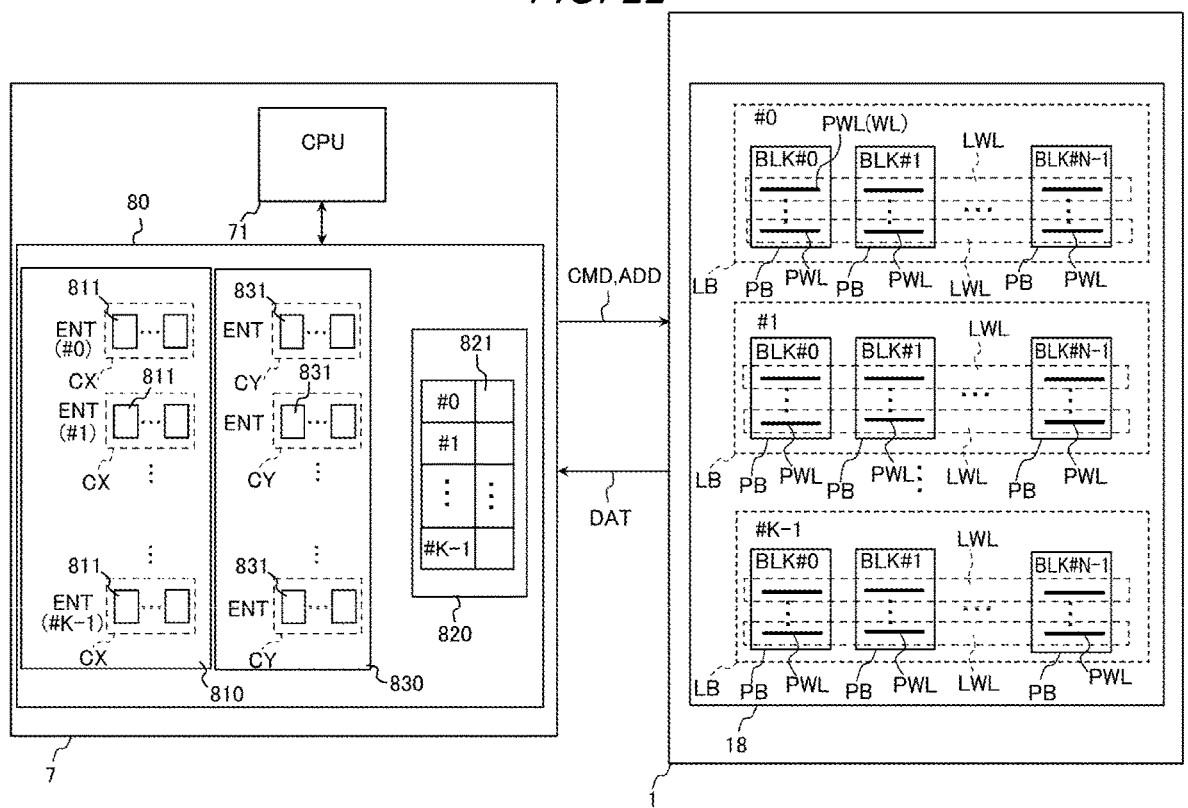
FIG. 22 is a diagram illustrating a configuration example of a memory system of a seventh embodiment.

With reference to FIG. 22, a memory system of a seventh embodiment and a control method therefor will be described.

In the above-described embodiments, a logical block and a physical block of the memory system are used for a count target unit.

However, the count target unit may be configured with a unit based on other logical structures and other physical structures.

For example, the count target unit may include a physical word line and/or a logical word line. A logical word line LWL is a management unit smaller than the logical block LB, and is a management unit larger than a physical word line PWL. The logical block LB includes a plurality of logical word lines LWL. Each logical word line LWL includes a plurality of physical word lines PWL.

In the memory system of at least one embodiment, the minimum unit of data management is, for example, a cluster. Thus, the number of executed read operations may be counted for each cluster.

For the above-described embodiments, an example was described in which the number of executed read operations is counted by two counters.

However, three or more counters may be hierarchical.

FIG. 22 is a diagram illustrating a configuration example of a count circuit of the memory system of the present embodiment.

In the example of FIG. 22, the count circuit 80 includes three hierarchical counters 810, 820, and 830.

The counter 810 counts the number of read operations on each physical word line WL. The counter 830 counts the number of read operations on each logical word line LWL. The counter 820 counts the number of read operations on each logical block LB.

The counter 830 has a plurality of count registers 831. Each of the plurality of count registers 831 is associated with corresponding one logical word line LWL among a plurality of logical word lines LWL. A counter group CY corresponding to each logical block LB is set in the counter 830. The counter group CY includes a plurality of count registers 831 corresponding to the plurality of logical word lines LWL belonging to the same logical block LB.

An entry and a count value of an entry unit are updated in each of the counters 810, 830, and 820 according to a threshold value of each count target unit in an order of, for example, the number of read operations on the physical block PB, the number of read operations on the logical word line LWL, and the number of read operations on the logical block LB. However, update of a count value may be substantially simultaneously executed in the respective counters 810, 830, and 820.

As mentioned above, the memory system of at least one embodiment can count the number of read operations on three or more different count target units by using a count circuit including three or more hierarchical counters.

(8) Eighth Embodiment

Figure 23:
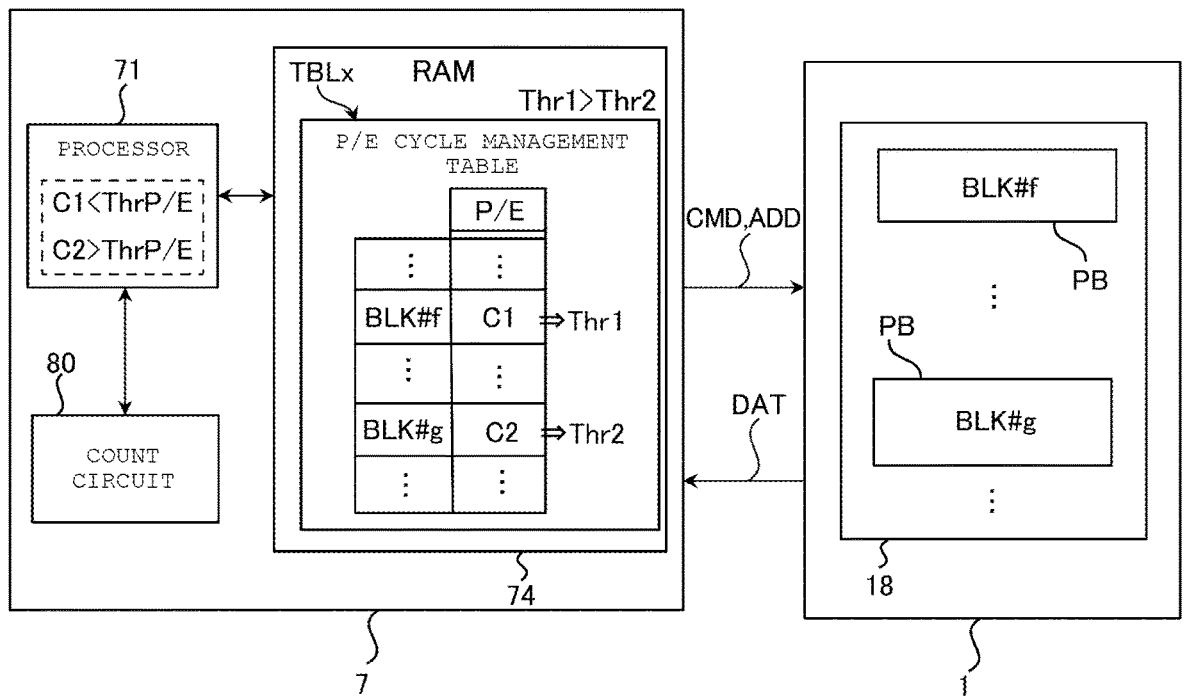
FIG. 23 is a diagram illustrating a configuration example of a memory system of an eighth embodiment.

With reference to FIG. 23, a memory system of an eighth embodiment will be described.

In at least one embodiment, a threshold value set for each count target unit and/or an increase amount of the number of times of read operation may be controlled according to a usage status of the count target unit.

FIG. 23 is a schematic diagram illustrating a configuration example of a memory system of at least one embodiment.

As illustrated in FIG. 23, the number of program/erase (also abbreviated to P/E) cycles for each physical block PB is stored in a management table (hereinafter, also referred to as a P/E cycle management table) TBLx in the RAM 74. For example, the number of P/E cycles is indicated by "C1" for a physical block PB with an index #f. The number of P/E cycles is indicated by "C2" for a physical block PB with an index #g.

Here, a threshold value ThrP/E related to the number of P/E cycles is assumed to be more than "C1" and less than "C2".

In a physical block of which the number of P/E cycles is large (that is, a physical block of which a use frequency is high), a tunnel insulating film of a memory cell tends to deteriorate. Thus, read disturb easily occurs.

In consideration of the magnitude of the influence of read disturb, the processor 71 sets a threshold value Thr2 for a logical block LB including the physical block PB(BLK #g), of which the number of P/E cycles is large, to a value smaller than a threshold value Thr1 for a logical block LB including the physical block (BLK #f), of which the number of P/E cycles is small.

In other words, when the number of P/E cycles for the physical block #f is indicated by C1, since the number C1 is less than the threshold value ThrP/E, a threshold value for the over-threshold process is set as "Thr1". Furthermore, when the number of P/E cycles for the physical block #g is indicated by C2, since the number C2 is more than the threshold value ThrP/E, a threshold value for the over-threshold process is set as "Thr2" less than "Thr1".

Consequently, the memory system of at least one present embodiment can reduce the influence of read disturb in the physical block PB of which a use frequency is high.

A threshold value related to the number of times of read operation may be set based on whether the number of P/E cycles is larger or smaller than a set threshold value.

The number of P/E cycles may be counted in the logical block unit.

(9) Ninth Embodiment

Figure 24:
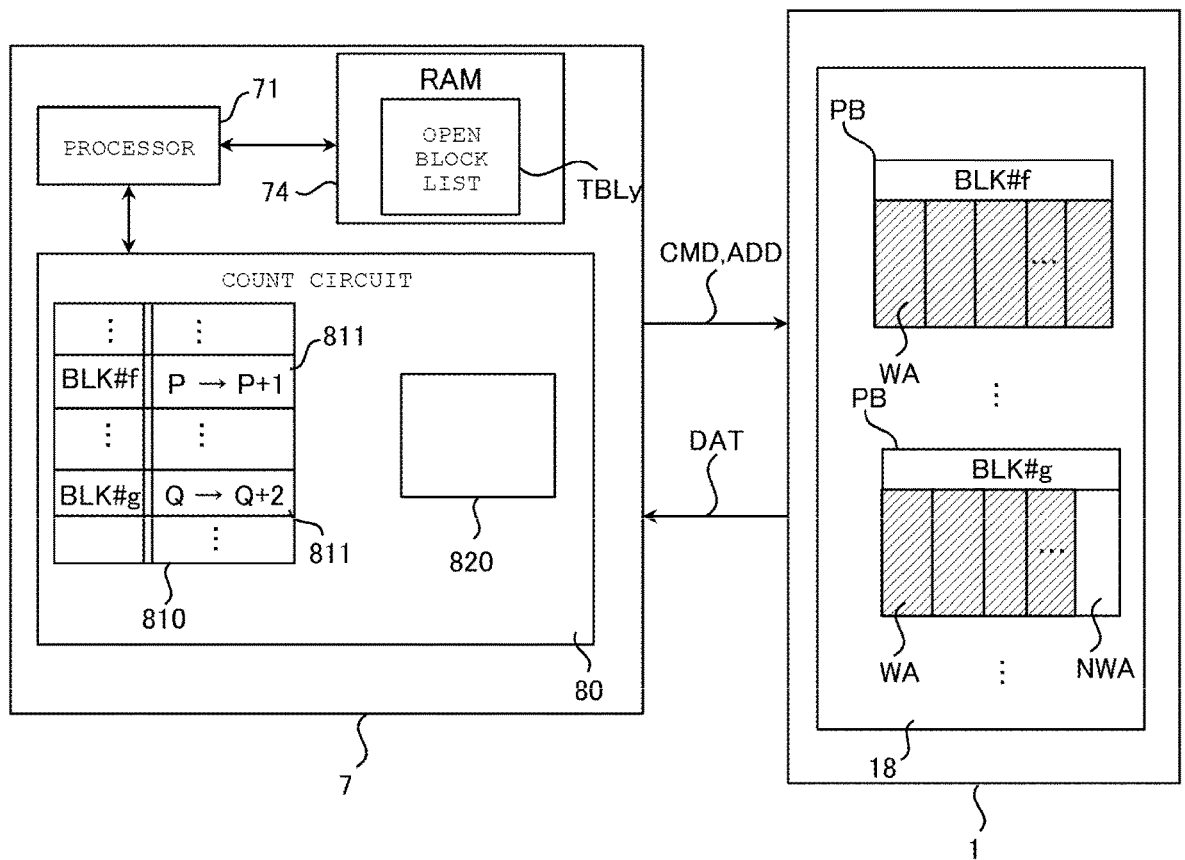
FIG. 24 is a diagram illustrating a configuration example of a memory system of a ninth embodiment.

FIG. 24 is a schematic diagram illustrating a configuration example of a memory system of at least one embodiment.

An increase amount of the number of read operations on a count target unit may be set to a value greater than one.

Read disturb may tend to occur more easily in a physical block including an unwritten region (hereinafter, referred to as an open block) than in a physical block not including an unwritten region (hereinafter, referred to as a closed block).

The unwritten region is a region in which, with respect to one or more word lines in the region, all memory cells connected to the word lines are in an erased state.

In at least one embodiment, an increase amount of the number of times of read operation corresponding to an open block in the fine counter 810 is set to be larger than an increase amount of the number of times of read operation corresponding to a closed block.

As illustrated in FIG. 24, a status of a write operation (in a physical word line unit) to a physical block is stored in a table (hereinafter, referred to as an open block list) TBLy in the RAM 74. In FIG. 24, a hatched region WA corresponds to a written region, and a white region NWA corresponds to an unwritten region.

For example, a physical block PB with an ID #BLKf is a closed block that does not include an unwritten region, and is filled with only the written regions WA. A physical block PB with an ID #BLKg is an open block that includes the unwritten region NWA. In this case, the ID #BLKg is stored in the open block list TBLy, and the ID #BLKf is not stored in the open block list TBLy.

When a read operation is executed on a closed block, the processor 71 adds "1" to the number P of read operations of an entry unit (that is, a counter register) corresponding to the closed block based on whether an ID thereof is stored in the open block list TBLy.

When a read operation is executed on an open block, the processor 71 adds a value (for example, "2") greater than "1" to the number Q of read operations of an entry unit corresponding to the open block based on whether an ID thereof is stored in the open block list TBLy.

Consequently, the memory system of at least one embodiment can reduce the influence of read disturb in the physical block PB including the unwritten region NWA.

(10) Others

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A memory system comprising:
a memory device having a memory cell array including a plurality of first units and at least one second unit, the second unit including the plurality of first units; and
a controller configured to:
count a first number of times of read operation for each of the plurality of first units, and
in response to the first number of times for one first unit among the plurality of first units reaching a first value, update a second number of times for the second unit that includes the one first unit, and
in response to the second number of times reaching a second value, determine whether to rewrite data stored in at least one of the first units included in the second unit,
wherein the controller includes
at least one first counter configured to count the first number of times, and
at least one second counter configured to count the second number of times,
wherein the at least one first counter comprises a plurality of first counters, the number of first counters being smaller than the number of first units, and
wherein the controller is configured to, in response to dynamically selecting, from among the plurality of first units, a first unit as a target for read operation, dynamically alter, from among the plurality of first units, a first unit as a target for counting the first number of times of read operation by the first counters.

2. The memory system according to claim 1, wherein the at least one second unit comprises a plurality of second units.

3. The memory system according to claim 1, wherein the controller stores first information related to the first number of times of read operation, and second information indicating a time at which the first data information is referred to, and
wherein the controller is configured to dynamically alter, from among the plurality of first units, the first unit as the target for counting the first number of times of read operation by the first counters, according to the second information.

4. The memory system according to claim 3, wherein, when an erase operation is executed on a first unit selected from among the plurality of first units, a value of the first number of times of read operation corresponding to the selected first unit is reset.

5. The memory system according to claim 1, wherein the first number of times of read operation is indicated by a first data size, and
wherein the second number of times is indicated by a second data size, the second data size being larger than the first data size.

6. The memory system according to claim 1, wherein the memory device has one or more physical blocks in the memory cell array,
wherein the first unit corresponds to a physical block of the one or more physical blocks, and
wherein the second unit corresponds to a logical block that includes a plurality of the physical blocks.

7. The memory system according to claim 1, wherein the at least one second unit comprises a plurality of second units and the memory cell array further includes at least one third unit, the third unit including the plurality of the second units,
wherein, when the second number of times for one second unit among the plurality of second units reaches a third value, the controller is configured to further update a third number of times for the third unit that includes the one second unit, and
wherein, when the third number of times reaches a fourth value, the controller is configured to further determine whether to rewrite data stored in at least one of the second units included in the third unit.

8. The memory system according to claim 1, wherein at least one of the first value or the second value is changed according to the number of times of erase operation performed on the plurality of first units.

9. The memory system according to claim 1, wherein each of the plurality of the first units includes a plurality of word lines each connecting a plurality of memory cells, and
the controller is configured to:
in response to a read operation being executed on a third unit, increase the first number by a fifth value, the third unit being one of the plurality of first units and including at least one word line that connects the plurality of memory cells all of which are in an erased state: and
in response to a read operation being executed on a first fourth unit, increase the first number by a sixth value smaller than the fifth value, the fourth unit being one of the plurality of first units and not including any one word line that connects the plurality of memory cells all of which are in the erased state.

10. A method of operating a memory system, the memory system comprising a memory device that has a memory cell array including a plurality of first units and at least one second unit, the second unit including the plurality of first units, the method comprising:
counting a first number of times of read operation for each of the plurality of first units;
in response to the first number of times for one first unit among the plurality of first units reaching a first value, updating a second number of times for the second unit that includes the one first unit; and
in response to the second number of times reaching a second value, determining whether to rewrite data stored in at least one of the first units included in the second unit,
wherein the at least one second unit comprises a plurality of second units and the memory cell array further includes at least one third unit, the third unit including the plurality of the second units, the method further comprises:
in response to the second number of times for one second unit among the plurality of second units reaching a third value, further updating a third number of times for the third unit that includes the one second unit; and
in response to the third number of times reaching a fourth value, further determining whether to rewrite data stored in at least one of the second units included in the third unit.

11. The method according to claim 10,
wherein the memory device has one or more physical blocks in the memory cell array,
wherein the first unit corresponds to a physical block of the one or more physical blocks, and
wherein the second unit corresponds to a logical block, the logical block including a plurality of the physical blocks.

12. The method according to claim 10,
wherein the memory device has one or more physical blocks in the memory cell array, and each of the one or more physical blocks has a plurality of physical word lines,
wherein the first unit corresponds to the physical word line, and
wherein the second unit corresponds to a logical word line, the logical word line including the plurality of physical word lines.

13. The method according to claim 10,
wherein at least one of the first value or the second value is changed according to the number of times of erase operation performed on the plurality of first units.

14. The method according to claim 10,
wherein each of the plurality of the first units includes a plurality of word lines each connecting a plurality of memory cells, and
in response to a read operation being executed on a third unit, increasing the first number by a fifth value, the third unit being one of the plurality of first units and including at least one word line that connects the plurality of memory cells all of which are in an erased state: and
in response to a read operation being executed on a fourth unit, increasing the first number by a sixth value smaller than the fifth value, the fourth unit being one of the plurality of first units and not including any one word line that connects the plurality of memory cells all of which are in the erased state.

15. A memory system comprising:
a memory device having a memory cell array including a plurality of first units and at least one second unit, the second unit including the plurality of first units; and
a controller configured to:
count a first number of times of read operation for each of the plurality of first units, and
in response to the first number of times for one first unit among the plurality of first units reaching a first value, update a second number of times for the second unit that includes the one first unit, and
in response to the second number of times reaching a second value, determine whether to rewrite data stored in at least one of the first units included in the second unit,
wherein the at least one second unit comprises a plurality of second units and the memory cell array further includes at least one third unit, the third unit including the plurality of the second units,
wherein, when the second number of times for one second unit among the plurality of second units reaches a third value, the controller is configured to further update a third number of times for the third unit that includes the one second unit, and
wherein, when the third number of times reaches a fourth value, the controller is configured to further determine whether to rewrite data stored in at least one of the second units included in the third unit.

16. The memory system according to claim 7,
wherein the memory device has one or more physical blocks in the memory cell array, and each of the one or more physical blocks has a plurality of physical word lines,
wherein the first unit corresponds to the physical word line, and
wherein the second unit corresponds to a logical word line, the logical word line including the plurality of physical word lines.

17. The memory system according to claim 7,
wherein the memory device has one or more physical blocks in the memory cell array, and each of the one or more physical blocks has a plurality of physical word lines,
wherein the first unit corresponds to the physical word lines, and
wherein the second unit corresponds to a logical word line, the logical word line including the plurality of physical word lines, and
wherein the third unit corresponds to a logical block, the logical block including a plurality of the logical word lines.

18. The memory system according to claim 15,
wherein the memory device has one or more physical blocks in the memory cell array,
wherein the first unit corresponds to a physical block of the one or more physical blocks, and
wherein the second unit corresponds to a logical block that includes a plurality of the physical blocks.

19. The memory system according to claim 15,
wherein at least one of the first value or the second value is changed according to the number of times of erase operation performed on the plurality of first units.

20. The memory system according to claim 15,
wherein each of the plurality of the first units includes a plurality of word lines each connecting a plurality of memory cells, and
the controller is configured to:
in response to a read operation bring executed on a third unit, increase the first number by a fifth value, the third unit being one of the plurality of first units and including at least one word line that connects the plurality of memory cells all of which are in an erased state: and
in response to a read operation bring executed on a fourth unit, increase the first number by a sixth value smaller than the fifth value, the fourth unit being one of the plurality of first units and not including any one word line that connects the plurality of memory cells all of which are in the erased state.

* * * * *